US011231799B2

(12) United States Patent
Rhe et al.

(10) Patent No.: US 11,231,799 B2
(45) Date of Patent: Jan. 25, 2022

(54) TOUCH DISPLAY DEVICE

(71) Applicant: LG Display Co., Ltd., Seoul (KR)

(72) Inventors: Ru-Da Rhe, Seoul (KR); Ji-Hyun Jung, Paju-si (KR); Deuk-Su Lee, Seoul (KR); Sang-Kyu Kim, Goyang-si (KR); Jae-Gyun Lee, Paju-si (KR); Hyang-Myoung Gwon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/922,667

(22) Filed: Jul. 7, 2020

(65) Prior Publication Data

US 2021/0048907 A1    Feb. 18, 2021

(30) Foreign Application Priority Data

Aug. 12, 2019  (KR) .................. 10-2019-0098073

(51) Int. Cl.
| | |
|---|---|
| *G09G 5/00* | (2006.01) |
| *G06F 3/041* | (2006.01) |
| *H01L 27/32* | (2006.01) |
| *H01L 51/52* | (2006.01) |

(52) U.S. Cl.
CPC .......... *G06F 3/0412* (2013.01); *G06F 3/0418* (2013.01); *H01L 27/323* (2013.01); *H01L 27/3246* (2013.01); *H01L 51/5246* (2013.01)

(58) Field of Classification Search
CPC .... G06F 3/0445; G06F 3/0446; G06F 3/0412; G06F 3/0416; G06F 3/0418; G06F 2203/04112; H01L 51/5246; H01L 51/5253; H01L 27/323; H01L 27/3244; H01L 27/3246

USPC .......................................... 345/173
See application file for complete search history.

(56) References Cited

U.S. PATENT DOCUMENTS

| | | | | |
|---|---|---|---|---|
| 2004/0256966 A1* | 12/2004 | Su | ................ | G02F 1/1345 313/38 |
| 2010/0320009 A1 | 12/2010 | Kuo et al. | | |
| 2013/0258613 A1* | 10/2013 | Yeh | .................. | G06F 3/0446 361/748 |

(Continued)

FOREIGN PATENT DOCUMENTS

| | | |
|---|---|---|
| EP | 3073358 | 9/2016 |
| EP | 3410276 | 12/2018 |

(Continued)

OTHER PUBLICATIONS

Search Report dated Dec. 15, 2020 issued in European Patent Application No. 20189895.4 (8 pages).

*Primary Examiner* — Jennifer T Nguyen
(74) *Attorney, Agent, or Firm* — Polsinelli PC

(57) ABSTRACT

A touch display device includes a touch sensing electrode and a touch drive electrode disposed on an encapsulation unit configured to encapsulate a light-emitting element, the touch sensing electrode and the touch drive electrode being configured to form a first mutual capacitor, and first and second compensation electrodes disposed in a non-active area of a substrate so as to be opposite each other, the first and second compensation electrodes being configured to form a second mutual capacitor, whereby the value of capacitance of all mutual capacitors is increased, and therefore it is possible to prevent deterioration in touch performance.

20 Claims, 20 Drawing Sheets

(56) References Cited

U.S. PATENT DOCUMENTS

| | | | |
|---|---|---|---|
| 2015/0084922 A1* | 3/2015 | Park | G06F 3/0446 |
| | | | 345/174 |
| 2016/0035307 A1* | 2/2016 | Jeon | G09G 3/20 |
| | | | 345/211 |
| 2017/0235397 A1 | 8/2017 | Saitou | |
| 2018/0033829 A1* | 2/2018 | Oh | H01L 27/323 |
| 2018/0348911 A1* | 12/2018 | Lee | G06F 3/0446 |

FOREIGN PATENT DOCUMENTS

| | | |
|---|---|---|
| JP | 2019-095841 | 6/2019 |
| WO | 2018209946 | 11/2018 |

* cited by examiner

TOUCH DISPLAY DEVICE

CROSS-REFERENCE TO RELATED APPLICATION

This application claims the benefit of Korean Patent Application No. 10-2019-0098073, filed on Aug. 12, 2019, which is hereby incorporated by reference in its entirety.

BACKGROUND

Field of the Disclosure

The present disclosure relates to a display device, and more particularly to a touch display device capable of preventing deterioration in touch performance.

Description of the Background

A touchscreen is an input device that allows a user to input a command by selecting one of instructions displayed on a screen, such as that of a display device, using a user's hand or an object. That is, the touchscreen converts the contact position, at which the user's hand or the object directly contacts the touchscreen, into an electrical signal to receive the instruction selected at the contact position as an input signal. Use of the touchscreen has increased, since the touchscreen is capable of replacing a separate input device that is connected to the display device for operation, such as a keyboard or a mouse.

The touchscreen includes a plurality of touch sensing electrodes, a plurality of touch drive electrodes, and a plurality of touch lines disposed between the plurality of touch sensing electrodes and the plurality of touch drive electrodes. In this case, the distance between the touch sensing electrode and the touch drive electrode is increased due to the touch lines, whereby the value of capacitance of a mutual capacitor formed between the touch sensing electrode and the touch drive electrode is reduced, and therefore touch performance is deteriorated. In addition, in the case in which the value of capacitance of the mutual capacitor is lower than that of a self-capacitor C_finger formed between the touch sensing electrode and the touch drive electrode and a pointer, such as a user finger or a pen, malfunction occurs.

SUMMARY

Accordingly, the present disclosure is directed to a touch display device that substantially obviates one or more problems due to limitations and disadvantages of the prior art.

The present disclosure is to provide a touch display device capable of preventing deterioration in touch performance.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a touch display device includes a touch sensing electrode and a touch drive electrode disposed on an encapsulation unit configured to encapsulate a light-emitting element, the touch sensing electrode and the touch drive electrode being configured to form a first mutual capacitor, and first and second compensation electrodes disposed in a non-active area of a substrate so as to be opposite each other, the first and second compensation electrodes being configured to form a second mutual capacitor, whereby the value of capacitance of all mutual capacitors is increased, and therefore it is possible to prevent deterioration in touch performance.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION OF THE DISCLOSURE

Hereinafter, aspects of the present disclosure will be described in detail with reference to the accompanying drawings.

Figure 1:
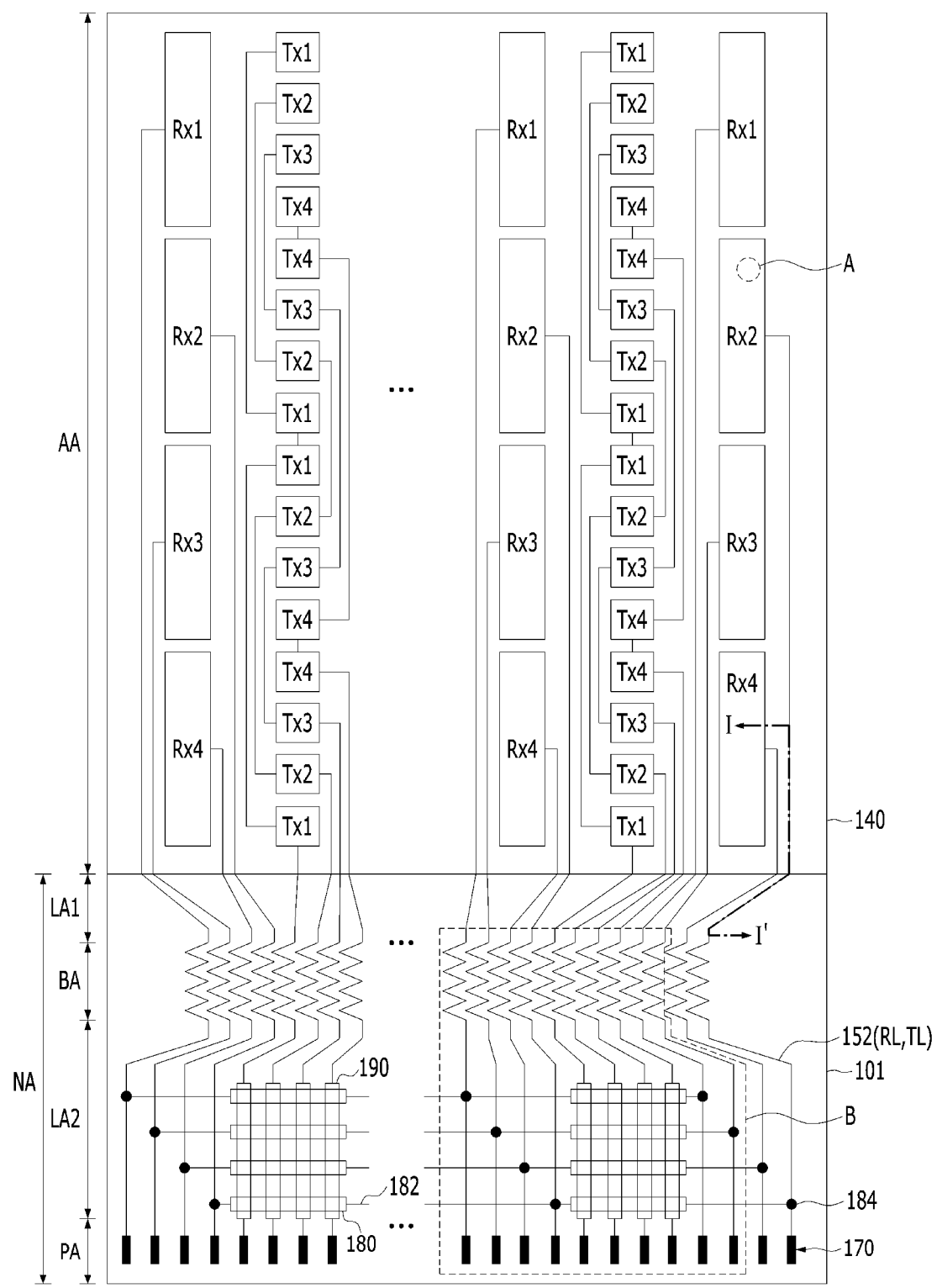
FIG. 1 is a plan view showing a touch display device according to the present disclosure.
Figure 2:
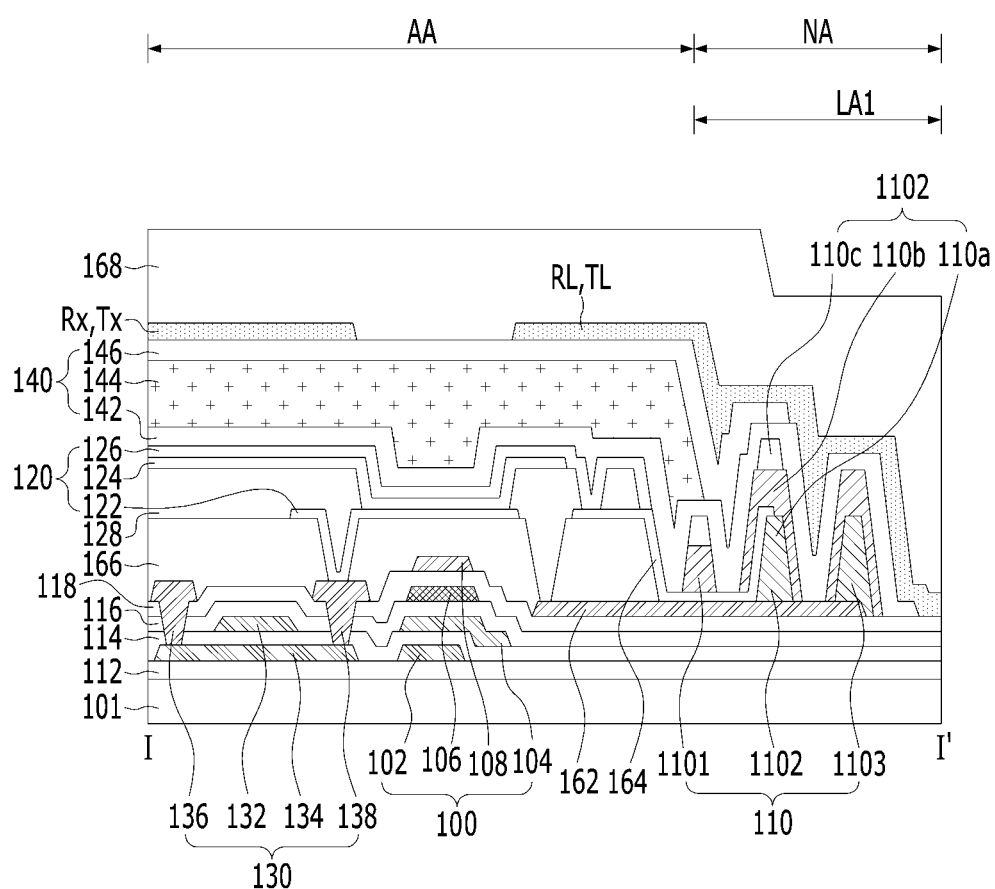
FIG. 2 is a cross-sectional view of the display device taken along line I-I' of FIG. 1.

FIG. 1 is a plan view showing a touch display device according to the present disclosure, and FIG. 2 is a cross-sectional view of the touch display device shown in FIG. 1.

The touch display device shown in FIGS. 1 and 2 performs a touch sensing function and a display function. That is, the touch display device displays an image through subpixels arranged in a matrix, and performs the touch sensing function using a plurality of touch electrodes.

To this end, the touch display device includes a plurality of subpixels arranged on a substrate 101 in a matrix, an encapsulation unit 140 disposed on the plurality of subpixels, and touch electrodes Tx and Rx disposed on the encapsulation unit 140.

The substrate 101 is made of a plastic material or a glass material having flexibility so as to be foldable or bendable. For example, the substrate 101 may be made of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

As shown in FIGS. 1 and 2, each of the plurality of subpixels includes a pixel drive circuit including a drive thin film transistor 130 and a storage capacitor 100 and a light-emitting element 120 connected to the pixel drive circuit.

In response to a data signal supplied to a gate electrode of the drive thin film transistor 130 included in the pixel drive circuit, the drive thin film transistor 130 controls current that is supplied from a high-voltage (VDD) supply line to the light-emitting element 120 to adjust the amount of light emitted by the light-emitting element 120.

As shown in FIG. 2, the drive thin film transistor 130 includes a semiconductor layer 134 disposed on a buffer layer 112, a gate electrode 132 overlapping with the semiconductor layer 134 in the state in which a gate dielectric film 114 is interposed therebetween, and source and drain electrodes 136 and 138 formed on interlayer dielectric films 116 and 118 so as to contact the semiconductor layer 134. Here, the semiconductor layer 134 is made of at least one of an amorphous semiconductor material, a polycrystalline semiconductor material, or an oxide semiconductor material.

The storage capacitor 100 includes at least two of first to fourth storage electrodes 102, 104, 106, and 108. The first storage electrode 102 is formed on the buffer layer 112, and is made of the same material as the semiconductor layer 134. The second storage electrode 104 is formed on the gate dielectric film 114 as a gate metal layer made of the same material as the gate electrode 132. The third storage electrode 106 is formed on the lower interlayer dielectric film 116 as a storage metal layer. The fourth storage electrode 108 is formed on the upper interlayer dielectric film 118 as a source and drain metal layer made of the same material as the source and drain electrodes 136 and 138.

The light-emitting element 120 includes an anode 122, at least one light-emitting stack 124 formed on the anode 122, and a cathode 126 formed on the light-emitting stack 124.

The anode 122 is electrically connected to the drain electrode 138 of the drive thin film transistor 130 exposed through a pixel contact hole formed through the interlayer dielectric films 116 and 118 and a pixel planarization layer 166.

The at least one light-emitting stack 124 is formed on the anode 122 in an emission area defined by a bank 128. The at least one light-emitting stack 124 is formed by stacking a hole-related layer, an organic light-emitting layer, and an electron-related layer on the anode 122 in that order or in reverse order. In addition, the light-emitting stack 124 may include first and second light-emitting stacks that are opposite each other in the state in which a charge generation layer is disposed therebetween. In this case, the organic light-emitting layer of one of the first and second light-emitting stacks generates blue light, and the organic light-emitting layer of the other of the first and second light-emitting stacks generates yellowish-green light. Consequently, white light is generated by the first and second light-emitting stacks. The white light generated by the light-emitting stack 124 is incident on a color filter, which is located above or under the light-emitting stack 124, to realize a color image. Alternatively, each light-emitting stack 124 may generate colored light corresponding to each subpixel without a separate color filter in order to realize a color image. That is, the light-emitting stack 124 of the red subpixel may generate red light, the light-emitting stack 124 of the green subpixel may generate green light, and the light-emitting stack 124 of the blue subpixel may generate blue light.

The cathode 126 is formed so as to be opposite the anode 122 in the state in which the light-emitting stack 124 is disposed therebetween. The cathode 126 is connected to a low-voltage (VSS) supply line via first and second auxiliary electrodes 162 and 164. The first auxiliary electrode 162 is made of the same material as the source and drain electrodes 136 and 138, and is disposed on the upper interlayer dielectric film 118. The first auxiliary electrode 162 is disposed on the upper interlayer dielectric film 118 so as to overlap with at least one of a plurality of dams 110.

The second auxiliary electrode 164 is made of the same material as the anode 132, and is disposed on the pixel planarization layer 166. The second auxiliary electrode 164 is connected to the first auxiliary electrode 162 exposed between the pixel planarization layer 166 disposed at the outermost side and a first sub dam layer 110a of a second dam 1102. In this case, the second auxiliary electrode 164 is formed so as to extend along the upper surface and the side surface of the pixel planarization layer 166 disposed at the outermost side, the upper surface of the first auxiliary electrode 162, and the side surface of the first sub dam layer 110a of the second dam 1102. In addition, the second auxiliary electrode 164 exposed between the banks 128 is connected to the cathode 126 on the pixel planarization layer 166.

The encapsulation unit 140 prevents external moisture or oxygen from permeating into the light-emitting element 120, which has low resistance to external moisture or oxygen. To this end, the encapsulation unit 140 includes at least one inorganic encapsulation layer 142 and at least one organic encapsulation layer 144. In the present disclosure, an encapsulation unit 140 having a structure in which a first inorganic encapsulation layer 142, an organic encapsulation layer 144, and a second inorganic encapsulation layer 146 are sequentially stacked will be described by way of example.

The first inorganic encapsulation layer 142 is formed on the substrate 101 on which the cathode 126 is formed. The second inorganic encapsulation layer 146 is formed on the substrate 101 on which the organic encapsulation layer 144 is formed, and is formed so as to surround the upper surface, the lower surface, and the side surface of the organic encapsulation layer 144 together with the first inorganic encapsulation layer 142.

The first and second inorganic encapsulation layers 142 and 146 minimize or prevent external moisture or oxygen from permeating into the light-emitting stack 124. Each of the first and second inorganic encapsulation layers 142 and 146 is made of an inorganic dielectric material that can be deposited at a low temperature, such as silicon nitride ($SiN_x$), silicon oxide ($SiO_x$), silicon oxynitride (SiON), or aluminum oxide ($Al_2O_3$). Consequently, each of the first and second inorganic encapsulation layers 142 and 146 is deposited in a low-temperature atmosphere, whereby it is possible to prevent damage to the light-emitting stack 124, which has low resistance to a high-temperature atmosphere, when each of the first and second inorganic encapsulation layers 142 and 146 is deposited.

The organic encapsulation layer 144 reduces stress between layers due to bending of an organic light-emitting display device and improves planarization. The organic encapsulation layer 144 is formed on the substrate 101 on which the first inorganic encapsulation layer 142 is formed, and is made of a non-photosensitive organic dielectric material, such as a particle cover layer (PCL), an acrylic resin, an epoxy resin, polyimide, polyethylene, or silicon oxycarbide (SiOC), or a photosensitive organic dielectric material, such as photo acrylic. The organic encapsulation layer 144 is disposed in an active area AA, excluding a non-active area NA. To this end, at least one dam 110 is disposed to prevent the organic encapsulation layer 144 from spreading to the non-active area NA. The at least one dam 110 is made of the same material as at least one of the pixel planarization layer 166, the bank 128, or a spacer (not shown). For example, in the case in which three dams 110 are provided, a first dam 1101, which is the most adjacent to the active area AA, is formed by sequentially stacking a second sub dam 110*b* made of the same material as the bank 128 and a third sub dam 110*c* made of the same material as the spacer. A third dam 1103, which is the most distant from the active area AA, is formed by sequentially stacking a first sub dam 110*a* made of the same material as the pixel planarization layer 166 and a second sub dam 110*b* made of the same material as the bank 128. A second dam 1102, which is disposed between the first and third dams 1101 and 1103, is formed by sequentially stacking a first sub dam 110*a* made of the same material as the pixel planarization layer 166, a second sub dam 110*b* made of the same material as the bank 128, and a third sub dam 110*c* made of the same material as the spacer. Meanwhile, since the organic encapsulation layer 144 is disposed on at least a portion of the first dam 1101, which is the most adjacent to the active area AA, the organic encapsulation layer 144 compensates for a step between each of the pixel planarization layer 166 and the bank 128 and the dam 110. In addition, the area in which the organic encapsulation layer 144 is formed may be defined by only the second and third dams 1102 and 1103 without the first dam 1101, which has the lowest height among the first to third dams 1101, 1102, and 1103.

A plurality of touch drive electrodes Tx, a plurality of touch sensing electrodes Rx, touch drive lines TL, and touch sensing lines RL are disposed on the encapsulation unit 140. The touch drive electrodes Tx, the touch sensing electrodes Rx, the touch drive lines TL, and the touch sensing lines RL are disposed as a single layer without a touch dielectric film. Consequently, the touch drive electrodes Tx, the touch sensing electrodes Rx, the touch drive lines TL, and the touch sensing lines RL may be formed through a one-time mask process, whereby it is possible to simplify the process and to reduce the thickness of the touch display device having the touch drive electrodes Tx, the touch sensing electrodes Rx, the touch drive lines TL, and the touch sensing lines RL.

User touch is sensed using a mutual-capacitance-based touch sensing method using the plurality of touch drive electrodes Tx and the plurality of touch sensing electrodes Rx. That is, when a touch drive signal for touch detection is supplied to the touch drive electrodes Tx, the capacitance between the touch drive electrodes Tx and the touch sensing electrodes Rx is changed depending on whether there is user touch, and whether there is touch and/or touch coordinates are determined using sensing signals transmitted from the touch sensing electrodes Rx to the touch drive circuit based on a change in capacitance.

Each of the plurality of touch drive electrodes Tx and the plurality of touch sensing electrodes Rx is formed so as to have a size corresponding to a plurality of subpixels in consideration of user touch area. For example, one touch drive electrode Tx has a size several times to several hundred times larger than one subpixel.

Figure 3:
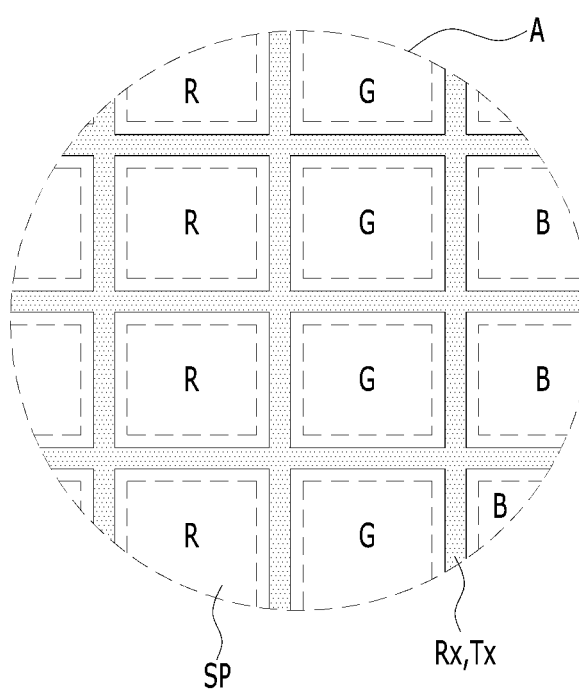
FIG. 3 is an enlarged plan view of area A of FIG. 1.

Each of the touch drive electrodes Tx and the touch sensing electrodes Rx is formed so as to have a single-layered structure or a multi-layered structure using a touch metal layer that exhibits high corrosion resistance, acid resistance, and conductivity, such as Ta, Ti, Cu, or Mo. For example, as shown in FIG. 3, each of the touch drive electrodes Tx and the touch sensing electrodes Rx using an opaque touch metal layer is formed in a mesh shape in which the touch electrode does not overlap with the emission area of each subpixel SP and overlaps with the bank 128, whereby it is possible to prevent reduction in an aperture ratio and transmittance. The mesh-shaped touch drive electrodes Tx and touch sensing electrodes Rx exhibit higher conductivity than a transparent conductive film, whereby the touch drive electrodes Tx and the touch sensing electrodes Rx may be formed as low-resistance electrodes. Consequently, the resistance and capacitance of each of the touch drive electrodes Tx and the touch sensing electrodes Rx are reduced, whereby RC delay is reduced and thus touch sensitivity is improved.

Each of the plurality of touch drive electrodes Tx and the plurality of touch sensing electrodes Rx includes at least two electrodes arranged in one direction. In the present disclosure, a structure in which each of the plurality of touch drive electrodes Tx and the plurality of touch sensing electrodes Rx includes four electrodes will be described by way of example.

Each of the touch sensing electrodes Rx is disposed so as to correspond to four touch drive electrodes Tx. For example, a first touch sensing electrode Rx is disposed so as to correspond to first to fourth touch drive electrodes Tx1, Tx2, Tx3, and Tx4. To this end, the length of each of first to fourth touch sensing electrodes Rx1, Rx2, Rx3, and Rx4 is greater than the length of a corresponding one of the first to fourth touch drive electrodes Tx1, Tx2, Tx3, and Tx4.

Each of the plurality of touch drive electrodes Tx is electrically connected to a corresponding one of the touch drive lines TL, and each of the plurality of touch sensing electrodes Rx is electrically connected to a corresponding one of the touch sensing lines RL.

The touch lines 152 including the touch drive lines TL and the touch sensing lines RL are disposed so as to overlap with the bank 128, whereby it is possible to prevent deterioration in an aperture ratio due to the touch lines 152. In addition, the touch lines 152 are disposed on the upper surface or the side surface of the second inorganic encapsulation layer 146, which is the uppermost layer of the encapsulation unit 140. Even when external oxygen or moisture is introduced through the touch lines 152, therefore, the oxygen or moisture is blocked by the encapsulation unit 140, whereby it is possible to protect the light-emitting stack 124 from the oxygen or moisture. For example, the touch lines 152 may be disposed on a touch buffer film 148 disposed on the second inorganic encapsulation layer 146 so as to contact the touch buffer film 148, or may be disposed on the second inorganic encapsulation layer 146 so as to contact the second inorganic encapsulation layer 146 without a separate touch buffer film.

Each of the touch lines 152 is electrically connected to a touch pad 170 disposed in a pad area PA. The touch pad 170 is formed so as to be exposed by a touch passivation film 168 and thus is connected to a signal transmission film on which a touch drive circuit (not shown) is mounted. Here, the touch passivation film 168 is formed so as to cover the touch electrodes Tx and Rx, whereby it is possible to prevent the touch electrodes Tx and Rx from being corroded by external moisture. The touch passivation film 168 is made of an organic insulating material, such as epoxy or acrylic, and is formed in the shape of a thin film or a film, or is made of an inorganic insulating material, such as SiNx or SiOx.

Meanwhile, as shown in FIG. 1, the touch sensing electrodes Rx and the touch drive electrodes Tx of the present disclosure are opposite each other in the state in which touch lines RL and TL are disposed therebetween. Consequently, the touch sensing electrodes Rx and the touch drive electrodes Tx do not overlap with each other in the vertical direction, whereby the value of capacitance of the first mutual capacitors Ca in the horizontal direction is low. In particular, the value of capacitance of the first mutual capacitors Ca in the horizontal direction is lower than that of a self-capacitor C_finger formed between each of the touch electrodes Tx and Rx and a pointer, such as a user finger or a pen, whereby malfunction occurs at the time of touch sensing.

Figure 4:
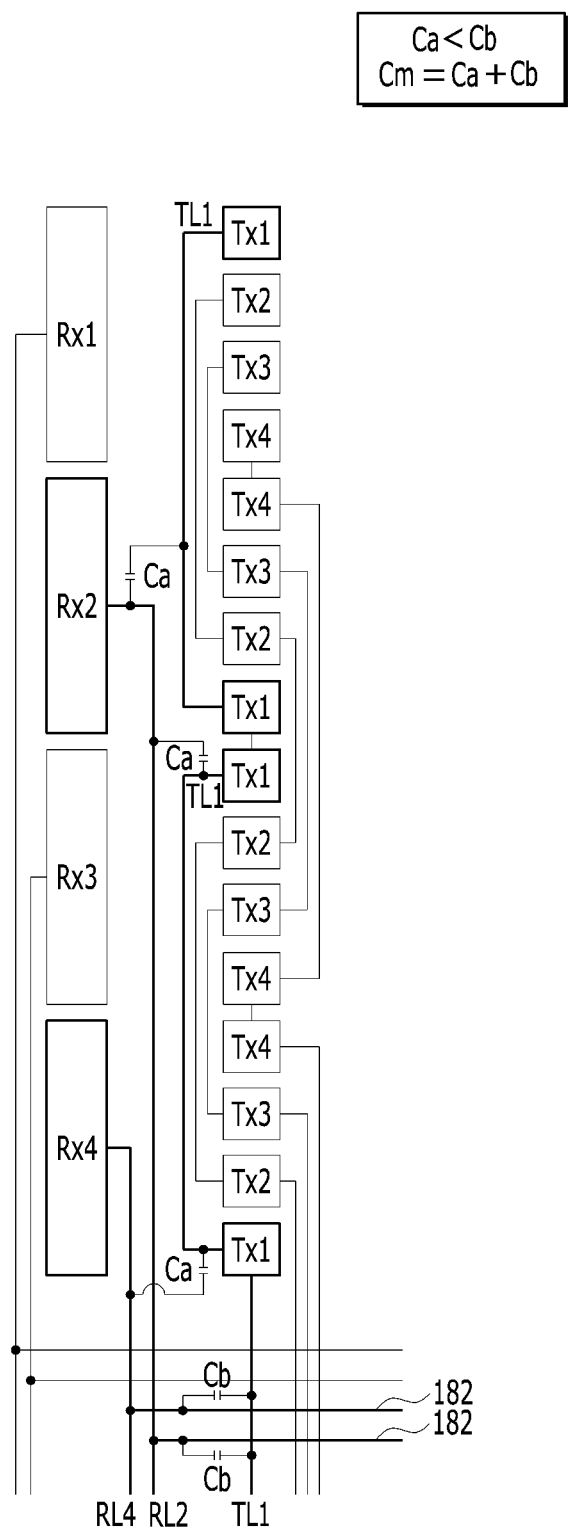
FIG. 4 is a view illustrating the value of capacitance of all mutual capacitors of each touch sensor of the touch display device according to the present disclosure.

In addition, the value of capacitance of the mutual capacitors is changed depending on the position of the touch sensing electrodes Rx. As shown in FIG. 4, an area in which a second touch sensing line RL2 electrically connected to the second touch sensing electrode Rx2 and a first touch drive line TL1 electrically connected to the first touch drive electrode Tx1 face each other is greater than an area in which a fourth touch sensing line RL4 electrically connected to the fourth touch sensing electrode Rx4 and the first touch drive line TL1 electrically connected to the first touch drive electrode Tx1 face each other. In this case, a plurality of first mutual capacitors Ca is formed between the second touch sensing line RL2 and the first touch drive line TL1, whereas a single mutual capacitor Ca is formed between the fourth touch sensing line RL4 and the first touch drive line TL1. In the present disclosure, therefore, a compensation circuit including second mutual capacitors Cb configured to increase the value of capacitance of all mutual capacitors Cm and to compensate for a deviation in the value of capacitance of the first mutual capacitors Ca depending on the position of the touch sensing electrodes Rx is included.

Figure 5:
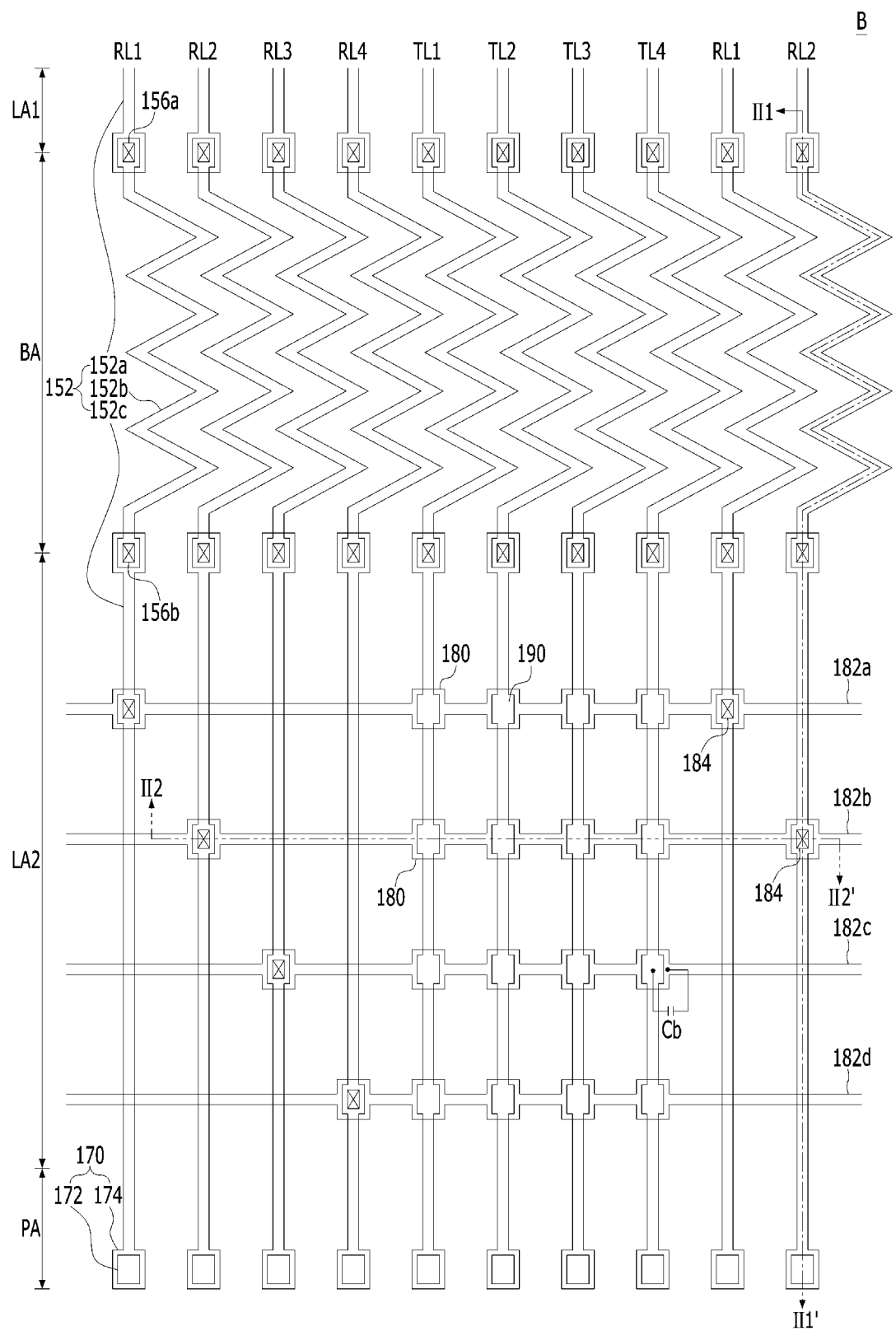
FIG. 5 is an enlarged plan view of a first aspect of area B of FIG. 1.
Figure 6:
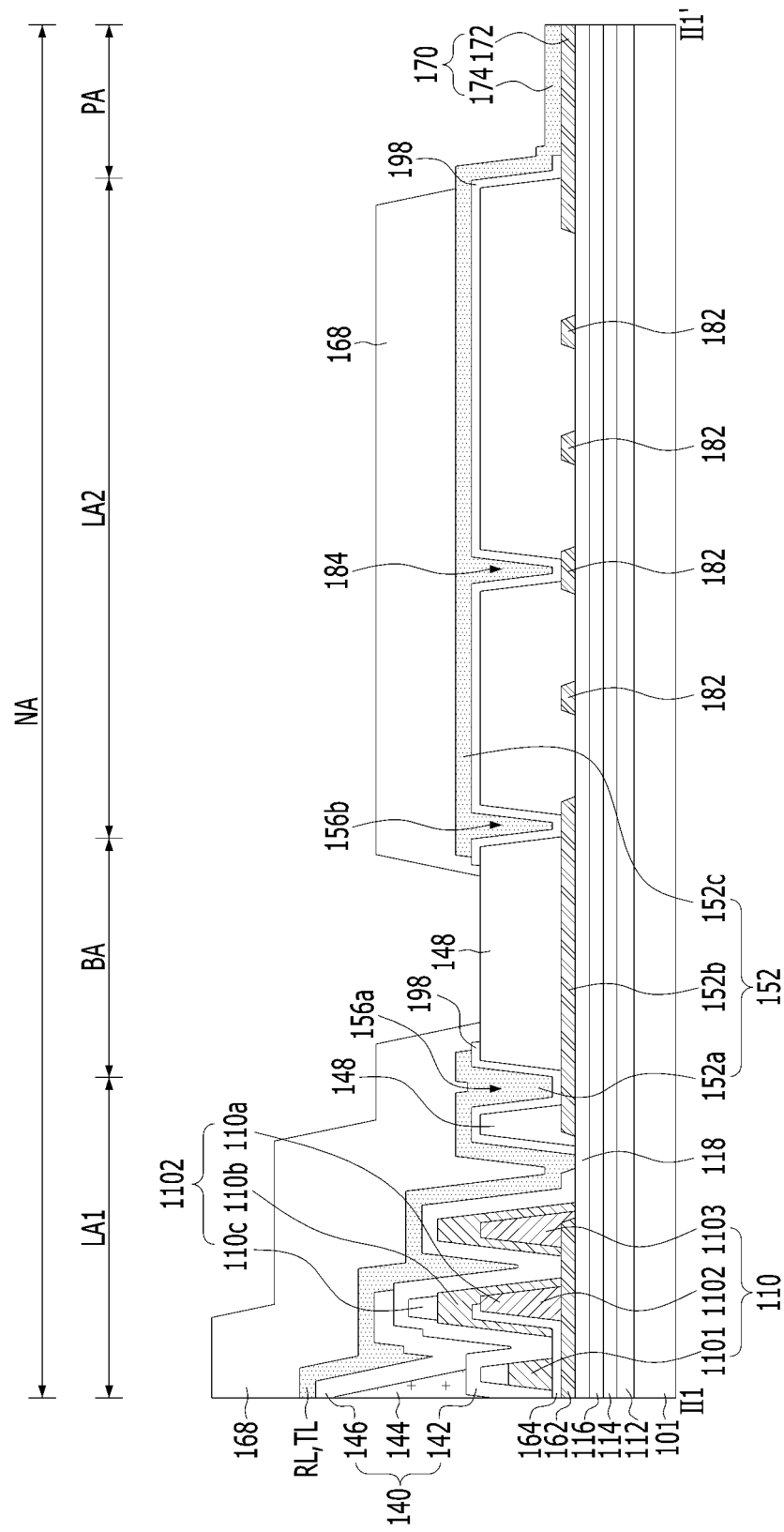
FIG. 6 is a cross-sectional view of the display device taken along line II1-II1' of FIG. 5.

FIGS. 5 and 6 are a plan view and a cross-sectional view showing a non-active area in which a second mutual capacitor of the touch display device according to a first aspect of the present disclosure is disposed.

As shown in FIGS. 5 and 6, touch sensing lines RL, touch drive lines TL, connection lines 182, touch pads 170, and second mutual capacitors Cb are disposed in the non-active area NA.

Touch lines 152 including the touch sensing lines RL and the touch drive lines TL are disposed in the non-active area NA including a first link area LA1, a bending area BA, and a second link area LA2.

The first link area LA1 is disposed between the active area AA and the bending area BA.

The second link area LA2 is disposed between the bending area BA and the pad area PA. Lighting inspection transistors are disposed in the second link area LA2.

The bending area BA is an area in which the substrate 101 is bendable or foldable, and corresponds to an area that is bent in order to locate the non-active area NA, which does not perform a display function, at the rear of the active area AA. In the entire screen of the display device, the area occupied by the active area AA is maximized and the area corresponding to the non-active area NA is minimized by the bending area BA. The bending area BA may be disposed in at least one of the upper side, the lower side, the left side, or the right side of the non-active area NA.

Signal lines including the touch lines 152 disposed in the bending area BA are disposed in a zigzag fashion, or a plurality of hollow polygonal structures, a plurality of hollow circular structures, or combinations thereof are connected to each other and disposed in a line. Consequently, it is possible to minimize damage to the signal lines including the touch lines 152 even when bending force is applied to the bending area BA. In addition, as shown in FIG. 6, a crack prevention layer 148 is disposed in the bending area BA.

The crack prevention layer 148 is disposed so as to cover the signal lines crossing the bezel area BA. For example, the crack prevention layer 148 is disposed on the second touch line 152b disposed in the bezel area BA on the upper interlayer dielectric film 118. The crack prevention layer 148 is made of an organic film material that exhibits higher strain and impact resistance than an inorganic film. For example, since the crack prevention layer 148 is formed together with at least one of the pixel planarization layer 166 or the bank 128, the crack prevention layer 148 is made of the same material as at least one of the pixel planarization layer 166 or the bank 128, and is disposed in the same plane as at least one of the pixel planarization layer 166 or the bank 128. Since the crack prevention layer 148 made of the organic film material has higher strain than an inorganic film material, bending stress generated when the substrate 101 is bent is reduced. Consequently, it is possible for the crack prevention layer 148 to prevent cracks from being formed in the bending area BA, thereby preventing cracks from spreading to the active area AA.

Each of the touch lines 152 including the touch sensing lines RL and the touch drive lines TL disposed in the bending area BA and the first and second link areas LA1 and LA2 includes first to third touch lines 152a, 152b, and 152c. The first touch line 152a extends from each of the touch sensing electrodes Rx and the touch drive electrodes Tx, and is disposed in the active area AA and the first link area LA1. The first touch line 152a is made of the same material as each of the touch sensing electrodes Rx and the touch drive electrodes Tx, and is formed through the same mask process as each of the touch sensing electrodes Rx and the touch drive electrodes Tx. The first touch line 152a is formed so as to have a single-layered structure or a multi-layered structure using a touch metal layer that exhibits high corrosion resistance, acid resistance, and conductivity, such as Al, Ta, Ti, Cu, or Mo. For example, the first touch line 152a is formed of Ti/Al/Ti.

The second touch line 152b is electrically connected to the first touch line 152a exposed through a first touch contact hole 156a formed through the crack prevention layer 148. The second touch line 152b is disposed in the bending area BA, and is formed through the same mask process as the source and drain electrodes 136 and 138 using the same material as the source and drain electrodes 136 and 138. In particular, since the second touch line 152b is formed so as to be longer than the first and third touch lines 152a and 152c, as shown in FIG. 3, the second touch line 152b is made of a metal that has lower resistance than the first and third touch lines 152a and 152c.

The third touch line 152c is electrically connected to the second touch line 152b exposed through a second touch contact hole 156b formed through the crack prevention layer 148. The third touch line 152c is disposed in the second link area LA2. The third touch line 152c is formed through the same mask process as each of the touch sensing electrodes Rx and the touch drive electrodes Tx using the same material as each of the touch sensing electrodes Rx and the touch drive electrodes Tx.

The touch line 152 including the first to third touch lines 152a, 152b, and 152c is electrically connected to the touch pad 170 disposed in the pad area PA. The touch pad 170 includes first and second touch pad electrodes 172 and 174.

The first touch pad electrode 172 is made of the same material as the second touch line 152b, and is disposed on the upper interlayer dielectric film 118.

Since the second touch pad electrode 174 extends from the third touch line 152c, the second touch pad electrode 174 is made of the same material as the third touch line 152c, and is disposed on the first touch pad electrode 172. The second touch pad electrode 174 is electrically connected to the first touch pad electrode 172 without a separate contact hole.

The connection lines 182 and the second mutual capacitors Cb are disposed in the second link area LA2 between the pad area PA, in which the touch pads 170 are disposed, and the bending area BA.

The connection lines 182 extend in a second direction so as to intersect the touch drive lines TL and the touch sensing lines RL extending in a first direction.

The connection lines 182 are formed in the same quantity as the touch sensing electrodes Rx disposed in a line in the active area AA, and interconnect the touch sensing lines RL. For example, in the case in which four touch sensing electrodes are disposed in a line, as shown in FIG. 1, four connection lines 182 are necessary. A first connection line 182a interconnects first touch sensing lines RL1 disposed so as to be spaced apart from each other in the state in which second to fourth touch sensing lines RL2, RL3, and RL4 and touch drive lines TL1, TL2, TL3, and TL4 are disposed therebetween. A second connection line 182a interconnects the second touch sensing lines RL2 disposed so as to be spaced apart from each other in the state in which the first, third, and fourth touch sensing lines RL1, RL3, and RL4 and the touch drive lines TL1, TL2, TL3, and TL4 are disposed therebetween. A third connection line 182c interconnects the third touch sensing lines RL3 disposed so as to be spaced apart from each other in the state in which the first, second, and fourth touch sensing lines RL1, RL2, and RL4 and the touch drive lines TL1, TL2, TL3, and TL4 are disposed therebetween. A fourth connection line 182d interconnects the fourth touch sensing lines RL4 disposed so as to be spaced apart from each other in the state in which the first to third touch sensing lines RL1, RL2, and RL3 and touch drive lines TL1, TL2, TL3, and TL4 are disposed therebetween.

At this time, the connection lines 182 are disposed in a different plane from the touch drive lines TL so as to be isolated from the touch drive lines. Since the third touch lines 152c of the touch drive lines TL disposed in the second link area LA2 are formed on the crack prevention layer 148 as a touch metal layer, the connection lines 182 are disposed on any one of the substrate 101, the buffer layer 112, the gate dielectric film 114, the lower interlayer dielectric film 116, and the upper interlayer dielectric film 118, which are disposed under the crack prevention layer 148. For example, the connection lines 182 are disposed on the upper interlayer dielectric film 118, and are made of the same material as the source and drain electrodes 136 and 138. In this case, the connection lines 182 are electrically connected to the third touch lines 152c of the touch sensing lines RL disposed in the second link area LA2 through connection contact holes 184 formed through the crack prevention layer 148.

The second mutual capacitor Cb is formed by first and second compensation electrodes 180 and 190 disposed in the second link area LA2 so as to be opposite each other in the vertical direction.

The first compensation electrodes 180 are formed so as to protrude from the connection lines 182 interconnecting the touch sensing lines RL, and the width of each of the first compensation electrodes 180 is greater than the width of a corresponding one of the touch sensing lines RL.

Figure 7:
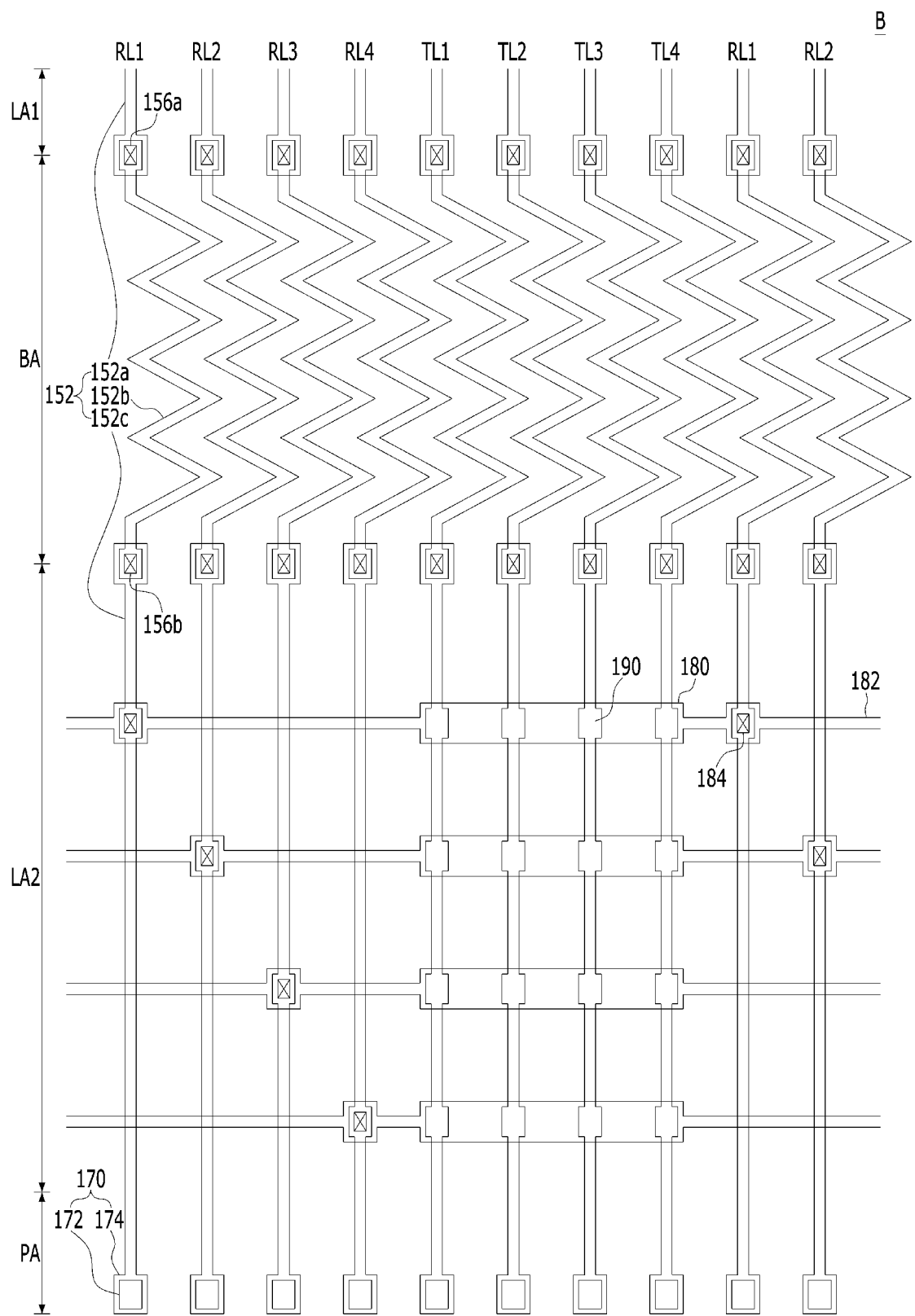
FIG. 7 is a plan view showing another aspect of a first compensation electrode shown in FIG. 5.

The first compensation electrode 180 is formed in a concave-convex shape, as shown in FIG. 5, or is formed in a rectangular shape, as shown in FIG. 7.

The concave-convex-shaped first compensation electrode 180 shown in FIG. 5 is formed so as to have a wide line width in an area overlapping with the second compensation electrode 190 and to have a narrow line width in an area not overlapping with the second compensation electrode 190. For example, the first compensation electrode 180 is formed so as to have a line width less than the line width of the connection line 182 in an area not overlapping with the second compensation electrode 190 and to have a line width greater than the line width of the connection line 182 in an area overlapping with the second compensation electrode 190. Since the first compensation electrode 180 is formed so as to have a narrow line width in an area not overlapping with the second compensation electrode 190, it is possible to minimize overlapping with a display signal line (not shown) electrically connected to the light-emitting element 120, thereby minimizing occurrence of a parasitic capacitor.

The quadrangular first compensation electrode 180 shown in FIG. 5 is formed so as to have the same line width in an area overlapping with the second compensation electrode 190 and in an area not overlapping with the second compensation electrode 190. For example, the first compensation electrode 180 is formed so as to have a line width greater than the line width of the connection line 182. Consequently, it is possible to prevent the first compensation electrode 180 from being broken in an area not overlapping with the second compensation electrode 190.

The second compensation electrode 190 is formed so as to protrude from each of the touch drive lines TL in an area overlapping with the first compensation electrode 180, and therefore the line width of the second compensation electrode 190 is greater than the line width of each of the touch drive lines TL.

Figure 8:
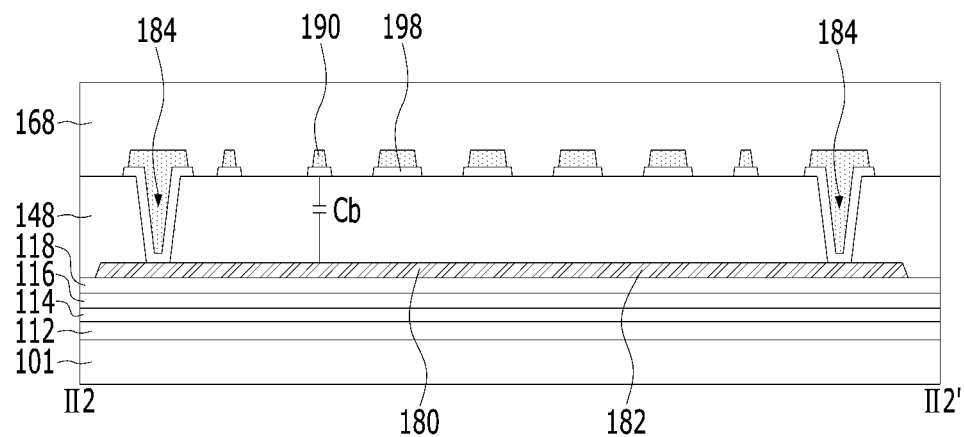
FIG. 8 is a cross-sectional view of the touch display device taken along line II2-II2' of FIG. 5.

As shown in FIG. 8, the first and second compensation electrodes 180 and 190 overlap with each other in the state in which the crack prevention layer 148, which is made of an organic film, is disposed therebetween to form a second mutual capacitor Cb. At this time, the first compensation electrode 180 is disposed on the upper interlayer dielectric film 118 as a source and drain metal layer made of the same material as the connection lines 182, and the second compensation electrode 190 is disposed on the crack prevention layer 148 as a touch metal layer made of the same material as the touch electrodes Tx and Rx.

The value of capacitance of the second mutual capacitor Cb including the first and second compensation electrodes 180 and 190 is formed so as to be greater than the value of capacitance of the first mutual capacitor Ca formed in the active area. To this end, the distance between the first and second compensation electrodes 180 and 190 that face each other in the vertical direction in the state in which the crack prevention layer 148 is disposed therebetween is formed so as to be less than the distance between the touch sensing line RL and the touch drive line TL that face each other in the active area AA in the horizontal direction. Alternatively, the overlapping with area between the first and second compensation electrodes 180 and 190 that face each other in the vertical direction in the state in which the crack prevention layer 148 is disposed therebetween is increased.

Consequently, the value of capacitance of the second mutual capacitor Cb including the first and second compensation electrodes 180 and 190 is formed so as to be greater than the value of capacitance of the first mutual capacitor Ca formed in the active area AA. The second mutual capacitor Cb is connected to the first mutual capacitor Ca in parallel, whereby the value of capacitance of all mutual capacitors Cm formed between the touch sensing electrodes Rx and the touch drive electrodes Tx becomes equal to the sum of the values of the capacitance of the first and second mutual capacitors Ca and Cb. At this time, the value of capacitance of the second mutual capacitor Cb is several times greater than the value of capacitance of the first mutual capacitor Ca, and therefore the effect of the value of capacitance of the first mutual capacitor Ca upon the value of capacitance of all mutual capacitors Cm is relatively small. Consequently, the values of capacitance of mutual capacitors Cm formed between the plurality of touch sensing electrodes Rx and the plurality of touch drive electrodes Tx become similar to each other, whereby it is possible to prevent deviation in the value of capacitance of mutual capacitors Cm by position of the touch sensing electrodes Rx and the touch drive electrodes Tx. In addition, the value of capacitance of all mutual capacitors Cm formed between the touch sensing electrodes Rx and the touch drive electrodes Tx is higher than the value of capacitance of the self-capacitor C_finger, whereby it is possible to prevent malfunction at the time of touch sensing.

In addition, the first and second compensation electrodes 180 and 190 of the present disclosure are disposed in the non-active area NA in which the encapsulation unit 140 is not formed. In the present disclosure, therefore, the first and second compensation electrodes 180 and 190 face each other in the state in which the crack prevention layer 148, which has a smaller thickness than the encapsulation unit 140 disposed in the active area, is disposed therebetween, whereby it is possible to increase the value of capacitance of the second mutual capacitor Cb. In addition, it is not necessary to provide a contact hole formed through the encapsulation unit 140, which has a large thickness, in order to connect one of the first and second compensation electrodes 180 and 190 to the touch line 152, whereby the manufacturing process is easily performed.

Furthermore, each of the first and second compensation electrodes 180 and 190 of the present disclosure is formed together with the signal line or the electrode disposed on the substrate 101 through the same mask process as the signal line or the electrode, whereby each of the first and second compensation electrodes 180 and 190 may be formed on the substrate 101 without an increase in area and cost.

Meanwhile, as shown in FIGS. 6 and 8, an adhesive reinforcement layer 198 is disposed between the crack prevention layer 140 and each of the first and third touch lines 152a and 152c, the second compensation electrode 190, and the second touch pad electrode 174. The adhesive reinforcement layer 198 is formed so as to include indium having high adhesive strength with a touch metal layer (e.g. Ti) included in each of the first and third touch lines 152a and 152c, the second compensation electrode 190, and the second touch pad electrode 174 and each of the organic films included in the crack prevention layer 148. For example, the adhesive reinforcement layer 198 is made of the same material as the anode 122, including an ITO-, IZO- or IGZO-based material, and is formed through the same mask process as the anode 122. In this case, the adhesive reinforcement layer 198 not only has high interface adhesive strength with each of the first and third touch lines 152a and 152c, the second compensation electrode 190, and the second touch pad electrode 174 but also has high interface adhesive strength with the crack prevention layer 148. Consequently, it is possible to prevent separation of each of the first and third touch lines 152a and 152c, the second compensation electrode 190, and the second touch pad electrode 174 from the crack prevention layer 148 even when impact is generated in a plurality of manufacturing processes performed to form the touch passivation film 168, which is the final process. Meanwhile, the adhesive reinforcement layer 198 may also be disposed between the touch passivation film 168 and each of the first and third touch lines 152a and 152c, the second compensation electrode 190, and the second touch pad electrode 174.

In the present disclosure, as described above, the adhesive reinforcement layer 198 is included, and therefore it is possible to prevent separation of each of the first and third touch lines 152a and 152c, the second compensation electrode 190, and the second touch pad electrode 174 from the crack prevention layer 148, thereby improving product yield.

Figure 9:
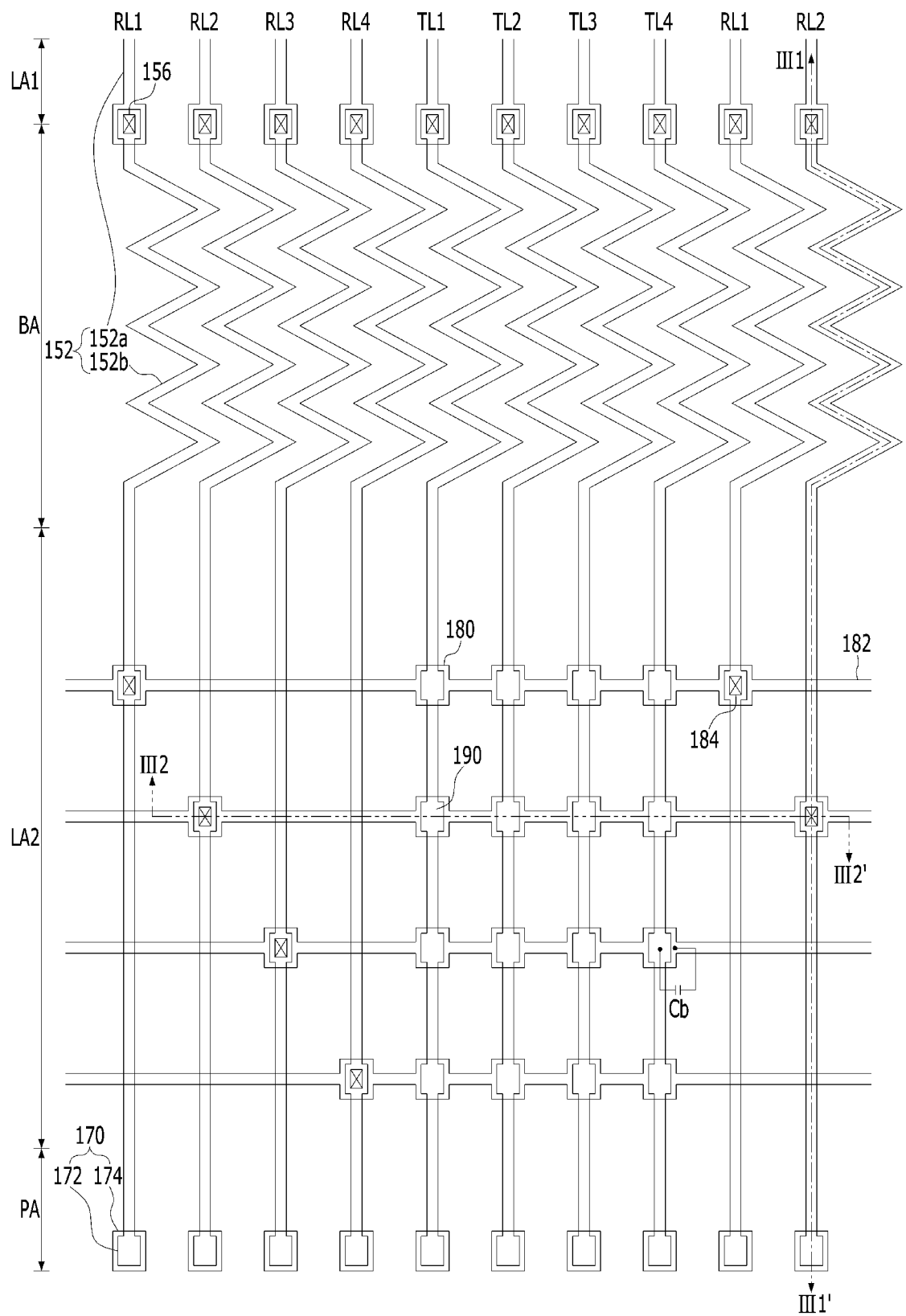
FIG. 9 is an enlarged plan view of a second aspect of area B of FIG. 1.
Figure 10:
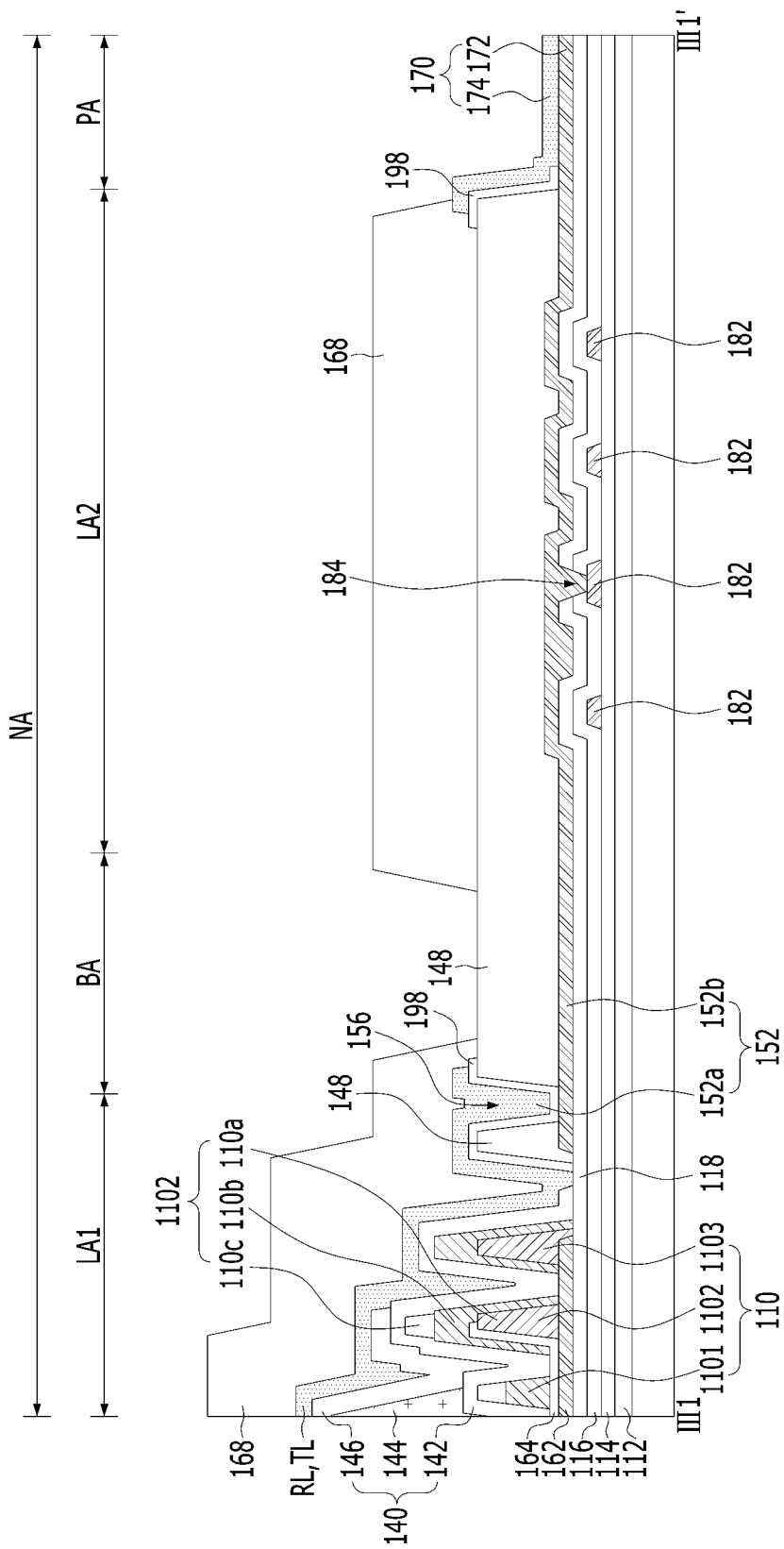
FIG. 10 is a cross-sectional view showing a first aspect of the touch display device taken along line III1-III1' of FIG. 9.

FIGS. 9 and 10 are a plan view and a cross-sectional view showing a non-active area in which a second mutual capacitor of the touch display device according to a second aspect of the present disclosure is disposed.

The touch display device shown in FIGS. 9 and 10 includes the same components as the touch display device shown in FIGS. 5 and 6 except that touch sensing lines RL and touch drive lines TL are made of the same material and are disposed in the same plane in a bending area BA and a second link area LA2. Consequently, a detailed description of the same components will be omitted.

Each of touch lines 152 including the touch sensing lines RL and the touch drive lines TL is formed as a first touch line 152a in a first link area LA1, and is formed as a second touch line 152b in the second link area LA2.

The first touch line 152a extends from each of touch sensing electrodes Rx and touch drive electrodes Tx, and is disposed in an active area AA and the first link area LA1. The first touch line 152a is made of the same material as each of the touch sensing electrodes Rx and the touch drive electrodes Tx, and is formed through the same mask process as each of the touch sensing electrodes Rx and the touch drive electrodes Tx. The first touch line 152a is formed so as to have a single-layered structure or a multi-layered structure using a touch metal layer that exhibits high corrosion resistance, acid resistance, and conductivity, such as Al, Ta, Ti, Cu, or Mo.

The second touch line 152b is electrically connected to the first touch line 152a exposed through a touch contact hole 156 formed through a crack prevention layer 148. The second touch line 152b is disposed in the bending area BA and the second link area LA2, and is formed through the same mask process as source and drain electrodes 136 and 138 using the same material as the source and drain electrodes 136 and 138.

Touch lines 152 including the first and second touch lines 152a and 152b are electrically connected to touch pads 170 disposed in the pad area PA.

Connection lines 182 and compensation capacitors CA are disposed in the second link area LA2 between the pad area PA, in which the touch pads are disposed, and the bending area BA.

The connection lines 182 are disposed in a different plane from the second touch lines 152b of the touch drive lines TL so as to be isolated from the touch drive lines TL.

The second touch lines 152b of the touch drive lines TL disposed in the second link area LA2 are formed on an upper interlayer dielectric film 118 as a source and drain metal layer. In this case, the connection lines 182 are disposed on the crack prevention layer 148 disposed on any one of a substrate 101, a buffer layer 112, a gate dielectric film 114, and a lower interlayer dielectric film 116, which are disposed under the upper interlayer dielectric film 118, or the upper interlayer dielectric film 118, as shown in FIGS. 10 and 12.

Figure 11:
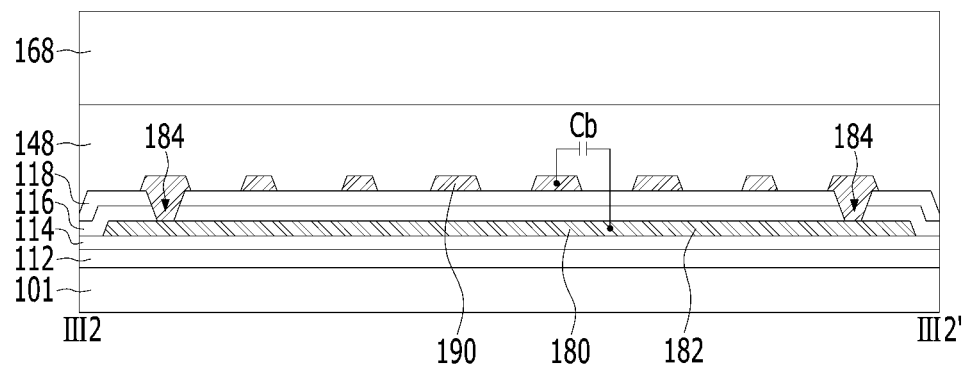
FIG. 11 is a cross-sectional view showing the first aspect of the touch display device taken along line III2-III2' of FIG. 9.

For example, the connection line 182 shown in FIG. 10 is disposed on the gate dielectric film 114, and is made of the same material as the gate electrode 132. In this case, the connection line 182 is electrically connected to the second touch line 152b of the touch sensing line RL disposed in the second link area LA2 through a connection contact hole 184 formed through the lower interlayer dielectric film 116 and the upper interlayer dielectric film 118. Since a first compensation electrode 180 protruding from the connection line 182 is formed so as to overlap with a second compensation electrode 190 in the state in which the lower interlayer dielectric film 116 and the upper interlayer dielectric film 118 are disposed therebetween, as shown in FIG. 11, a second mutual capacitor Cb is formed. At this time, the first compensation electrode 180 is formed on the gate dielectric film 114 as a gate metal layer made of the same material as the connection line 182, and the second compensation electrode 190 is formed on the upper interlayer dielectric film 118 as a source and drain metal layer made of the same material as the source and drain electrodes 136 and 138.

Figure 12:
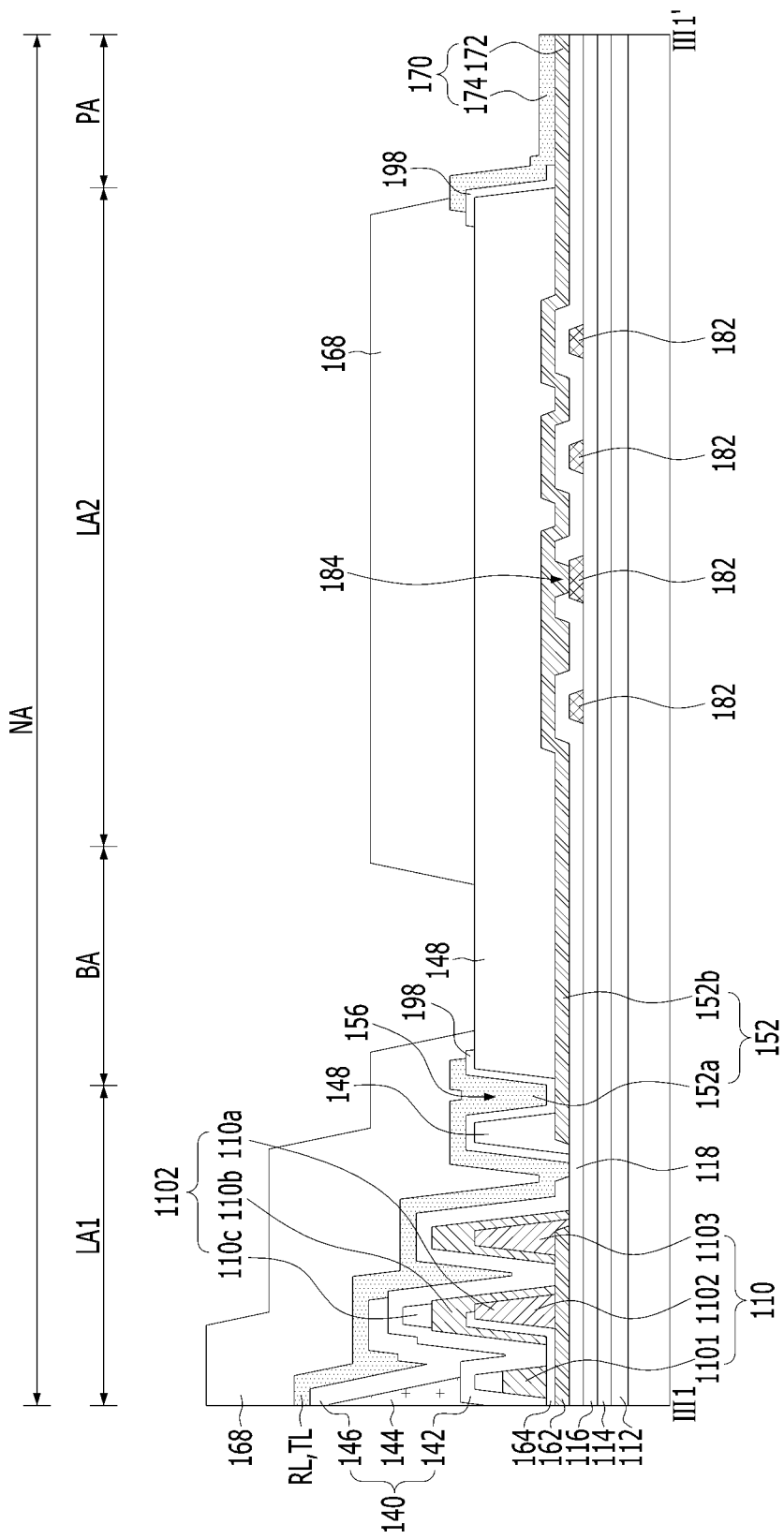
FIG. 12 is a cross-sectional view showing a second aspect of the touch display device taken along line III1-III1' of FIG. 9.
Figure 13:
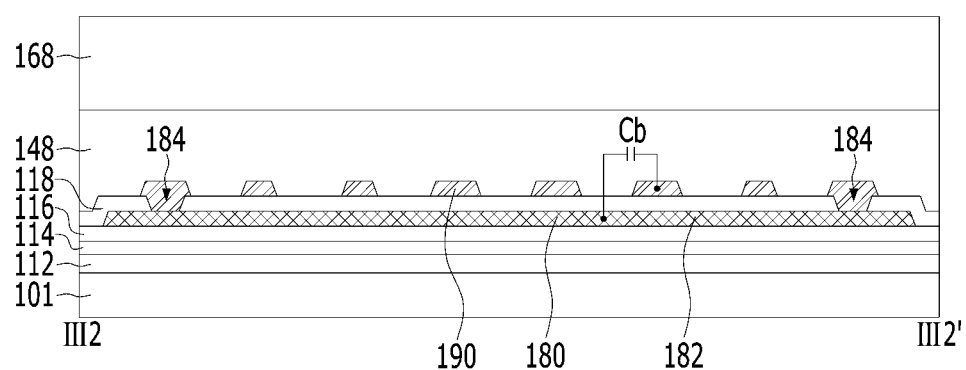
FIG. 13 is a cross-sectional view showing the second aspect of the touch display device taken along line III2-III2' of FIG. 9.

The connection line 182 shown in FIG. 12 is disposed on the lower interlayer dielectric film 116, and is made of the same material as a third storage electrode 106. In this case, the connection line 182 is electrically connected to the second touch line 152b of the touch sensing line RL disposed in the second link area LA2 through a connection contact hole 184 formed through the upper interlayer dielectric film 118. Since a first compensation electrode 180 protruding from the connection line 182 is formed so as to overlap with a second compensation electrode 190 in the state in which the upper interlayer dielectric film 118 is disposed therebetween, as shown in FIG. 13, a second mutual capacitor Cb is formed. At this time, the first compensation electrode 180 is formed on the lower interlayer dielectric film 116 as a storage metal layer made of the same material as the third storage electrode 106, and the second compensation electrode 190 is formed on the upper interlayer dielectric film 118 as a source and drain metal layer made of the same material as the source and drain electrodes 136 and 138.

The value of capacitance of the second mutual capacitor Cb including the first and second compensation electrodes 180 and 190 shown in FIGS. 11 and 13 is formed so as to be greater than the value of capacitance of a first mutual capacitor Ca formed in the active area AA. The second mutual capacitor Cb is connected to the first mutual capacitor Ca in parallel, whereby the value of capacitance of all mutual capacitors Cm formed between the touch sensing electrodes Rx and the touch drive electrodes Tx becomes equal to the sum of the values of the capacitance of the first and second mutual capacitors Ca and Cb. At this time, the value of capacitance of the second mutual capacitor Cb is several times greater than the value of capacitance of the first mutual capacitor Ca, and therefore the effect of the value of capacitance of the first mutual capacitor Ca upon the value of capacitance of all mutual capacitors Cm is relatively small. Consequently, the values of capacitance of mutual capacitors Cm formed between the plurality of touch sensing electrodes Rx and a the plurality of touch drive electrodes Tx become similar to each other, whereby it is possible to prevent deviation in the value of capacitance of mutual capacitors Cm by position of the touch sensing electrodes Rx and the touch drive electrodes Tx.

In addition, the value of capacitance of all mutual capacitors Cm formed between the touch sensing electrodes Rx and the touch drive electrodes Tx is higher than the value of capacitance of a self-capacitor C_finger, whereby it is possible to prevent malfunction at the time of touch sensing.

Furthermore, the first and second compensation electrodes 180 and 190 of the present disclosure are disposed in the non-active area NA in which an encapsulation unit 140 is not formed. In the present disclosure, therefore, the first and second compensation electrodes 180 and 190 face each other in the state in which the lower and upper interlayer dielectric films 116 and 118, which have a smaller thickness than the encapsulation unit 140 disposed in the active area, or the upper interlayer dielectric film 118 is disposed therebetween, whereby it is possible to increase the value of capacitance of the second mutual capacitor Cb. In addition, it is not necessary to provide a contact hole formed through the encapsulation unit 140, which has a large thickness, in order to connect one of the first and second compensation electrodes 180 and 190 to the touch line 152, whereby the manufacturing process is easily performed.

Figure 14:
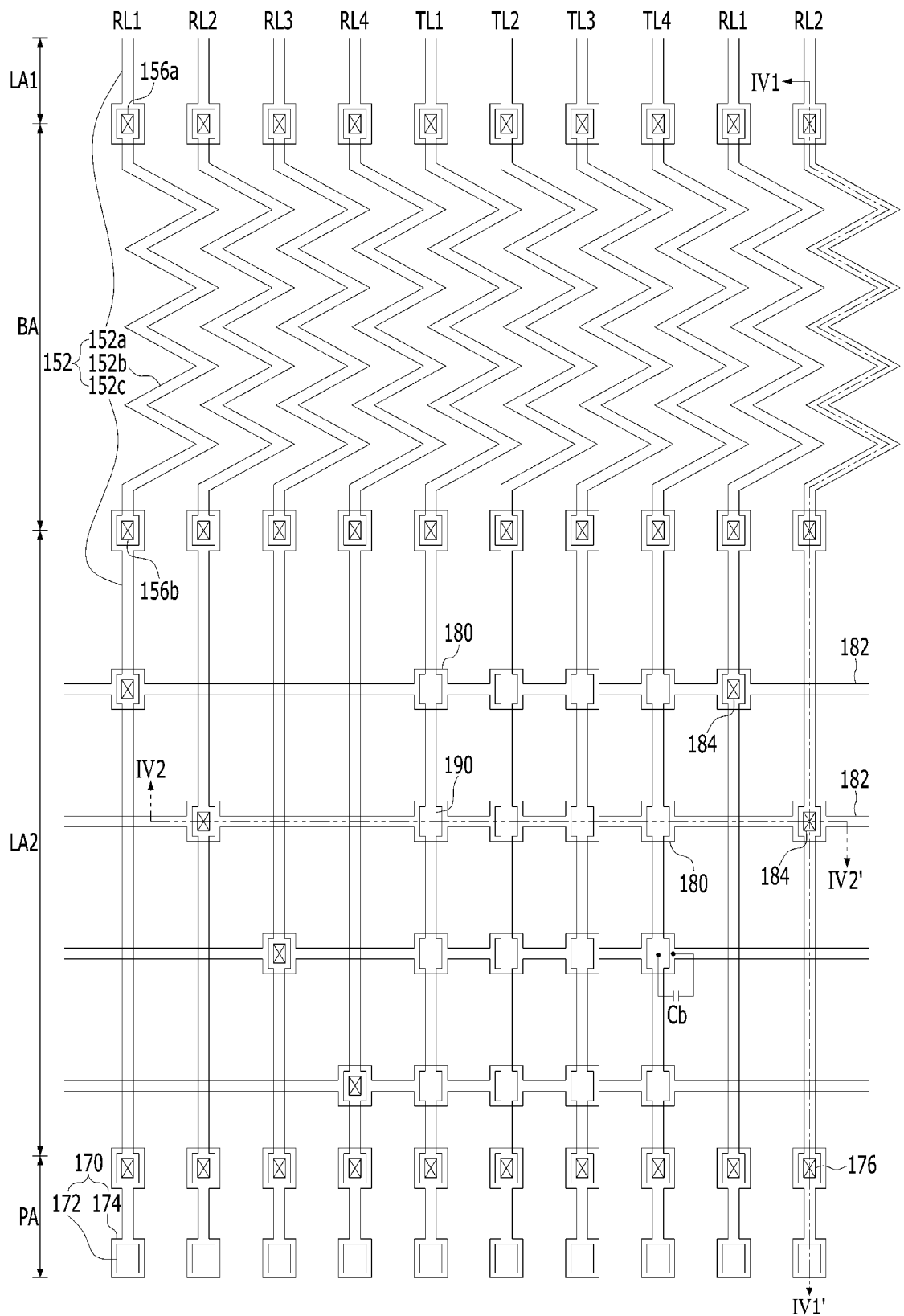
FIG. 14 is an enlarged plan view of a third aspect of area B of FIG. 1.
Figure 15:
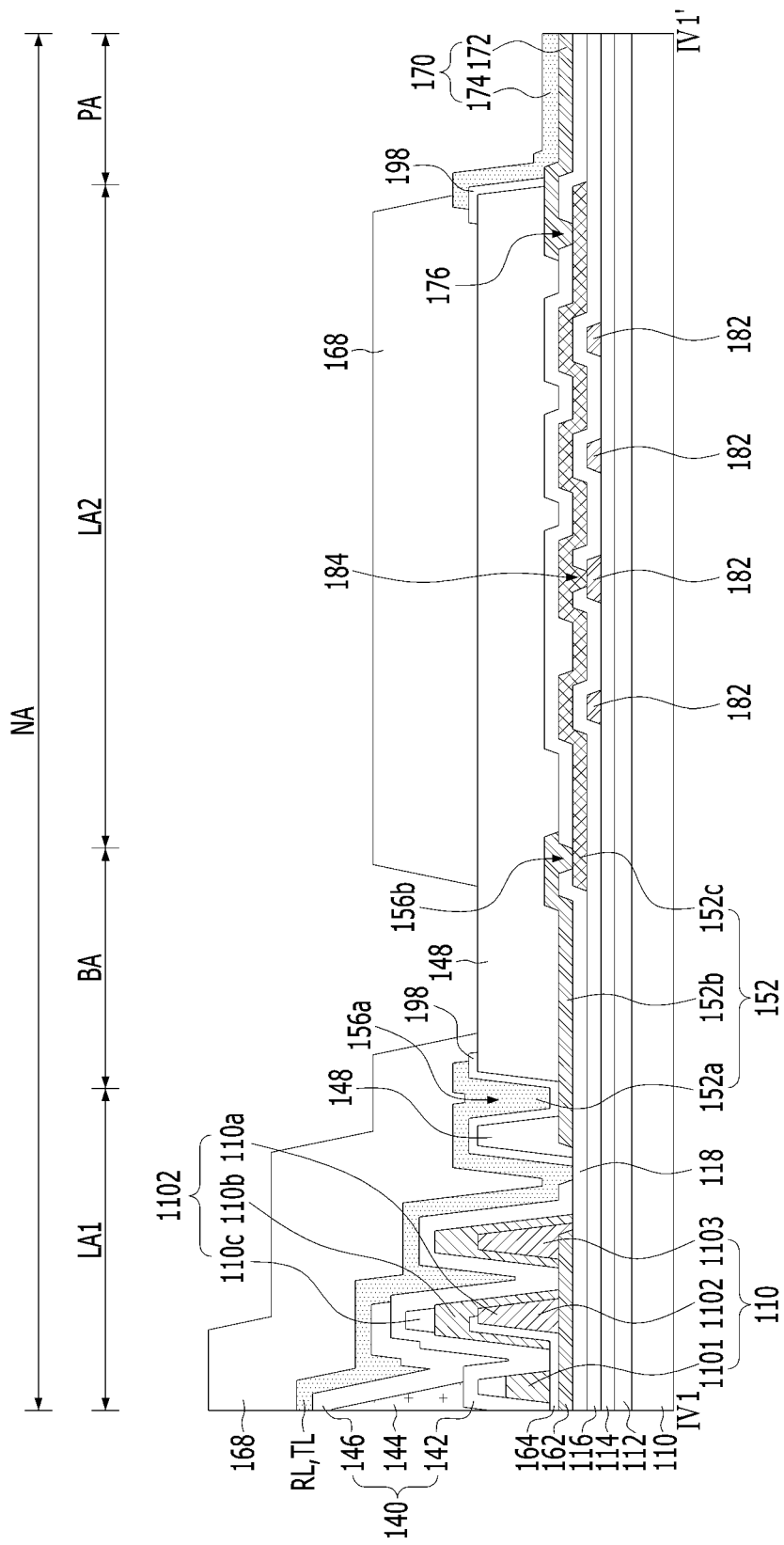
FIG. 15 is a cross-sectional view of the display device taken along line IV1-IV1' of FIG. 14.

FIGS. 14 and 15 are a plan view and a cross-sectional view showing a non-active area in which a second mutual capacitor of the touch display device according to a third aspect of the present disclosure is disposed.

The touch display device shown in FIGS. 14 and 15 includes the same components as the touch display device shown in FIGS. 5 and 6 except that a touch pad contact hole 176 is further included. Consequently, a detailed description of the same components will be omitted.

Each of touch lines 152 including touch sensing lines RL and touch drive lines TL is formed as a first touch line 152a in a first link area LA1, is formed as a second touch line 152b in a bending area BA, and is formed as a third touch line 152c in a second link area LA2.

The first touch line 152a extends from each of touch sensing electrodes Rx and touch drive electrodes Tx, and is disposed in an active area AA and the first link area LA1. The first touch line 152a is made of the same material as each of the touch sensing electrodes Rx and the touch drive electrodes Tx, and is formed through the same mask process as each of the touch sensing electrodes Rx and the touch drive electrodes Tx.

The second touch line 152b is electrically connected to the first touch line 152a exposed through a first touch contact hole 156a formed through a crack prevention layer 148. The second touch line 152b is disposed in the bending area BA and the second link area LA2, and is formed through the same mask process as source and drain electrodes 136 and 138 using the same material as the source and drain electrodes 136 and 138.

The third touch line 152c is electrically connected to the second touch line 152b exposed through a second touch contact hole 156b formed through an upper interlayer dielectric film 118. The third touch line 152c is disposed in the second link area LA2. The third touch line 152c is formed through the same mask process as a third storage electrode 106 using a storage metal layer made of the same material as the third storage electrode.

A touch line 152 including the first to third touch lines 152a, 152b, and 152c is electrically connected to a touch pad 170 disposed in the pad area PA. The touch pad 170 includes first and second touch pad electrodes 172 and 174.

The first touch pad electrode 172 is made of a different material from the third touch line 152c, and is disposed in a different plane from the third touch line 152c. For example, the first touch pad electrode 172 is disposed on the upper interlayer dielectric film 118 as the same source and drain metal layer as the source and drain electrodes, and the third touch line is disposed on the lower interlayer dielectric film 116 as the same storage metal layer as the third storage electrode 106. Consequently, the first touch pad electrode 172 is electrically connected to the third touch line 152c exposed through a pad contact hole 176 formed through the upper interlayer dielectric film 118.

The second touch pad electrode 174 is made of the same material as the touch sensing electrodes Rx and the touch drive electrodes Tx, and is disposed on the first touch pad electrode 172. The second touch pad electrode 174 is electrically connected to the first touch pad electrode 172 without a separate contact hole.

Connection lines 182 and compensation capacitors CA are disposed in the second link area LA2 between the pad area PA, in which the touch pads are disposed, and the bending area BA.

The connection lines 182 are disposed in a different plane from the third touch lines 152c of the touch drive lines TL so as to be isolated from the touch drive lines TL.

The third touch lines 152c of the touch drive lines TL disposed in the second link area LA2 are formed on the lower interlayer dielectric film 116 as a storage metal layer. In this case, the connection lines 182 are disposed on the crack prevention layer 148 disposed on any one of a substrate 101, a buffer layer 112, and a gate dielectric film 114, which are disposed under the lower interlayer dielectric film 116, the upper interlayer dielectric film 118, or the crack prevention layer 148.

Figure 16:
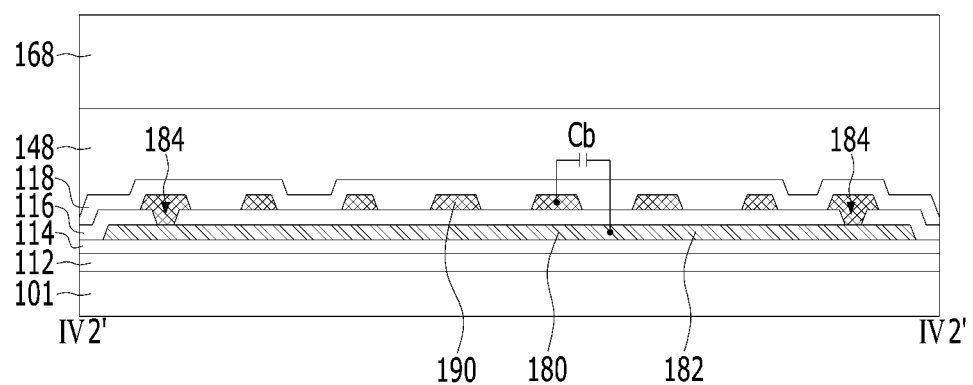
FIG. 16 is a cross-sectional view of the display device taken along line IV2-IV2' of FIG. 14.

For example, the connection line 182 is disposed on the gate dielectric film 114, and is made of the same material as the gate electrode 132. In this case, the connection line 182 is electrically connected to the third touch line 152c of the touch sensing line RL disposed in the second link area LA2 through a connection contact hole 184 formed through the lower interlayer dielectric film 116. Since a first compensation electrode 180 protruding from the connection line 182 is formed so as to overlap with a second compensation electrode 190 in the state in which the lower interlayer dielectric film 116 is disposed therebetween, as shown in FIG. 16, a second mutual capacitor Cb is formed. At this time, the first compensation electrode 180 is formed on the gate dielectric film 114 as a gate metal layer made of the same material as the connection line 182, and the second compensation electrode 190 is formed on the lower interlayer dielectric film 116 as a storage metal layer made of the same material as the third storage electrode 106.

The value of capacitance of the second mutual capacitor Cb including the first and second compensation electrodes 180 and 190 is formed so as to be greater than the value of capacitance of a first mutual capacitor Ca formed in the active area AA. The second mutual capacitor Cb is connected to the first mutual capacitor Ca in parallel, whereby the value of capacitance of all mutual capacitors Cm formed between the touch sensing electrodes Rx and the touch drive electrodes Tx becomes equal to the sum of the values of the capacitance of the first and second mutual capacitors Ca and Cb. At this time, the value of capacitance of the second mutual capacitor Cb is several times greater than the value of capacitance of the first mutual capacitor Ca, and therefore the effect of the value of capacitance of the first mutual capacitor Ca upon the value of capacitance of all mutual capacitors Cm is relatively small. Consequently, the values of capacitance of mutual capacitors Cm formed between the plurality of touch sensing electrodes Rx and the plurality of touch drive electrodes Tx become similar to each other, whereby it is possible to prevent deviation in the value of capacitance of mutual capacitors Cm by position of the touch sensing electrodes Rx and the touch drive electrodes Tx.

In addition, the value of capacitance of all mutual capacitors Cm formed between the touch sensing electrodes Rx and the touch drive electrodes Tx is higher than the value of capacitance of a self-capacitor C_finger, whereby it is possible to prevent malfunction at the time of touch sensing.

Furthermore, the first and second compensation electrodes 180 and 190 of the present disclosure are disposed in the non-active area NA in which an encapsulation unit 140 is not formed. In the present disclosure, therefore, the first and second compensation electrodes 180 and 190 face each other in the state in which the lower interlayer dielectric film 116, which has a smaller thickness than the encapsulation unit 140 disposed in the active area, is disposed therebetween, whereby it is possible to increase the value of capacitance of the second mutual capacitor Cb. In addition, it is not necessary to provide a contact hole formed through the encapsulation unit 140, which has a large thickness, in order to connect one of the first and second compensation electrodes 180 and 190 to the touch line 152, whereby the manufacturing process is easily performed.

Figure 17:
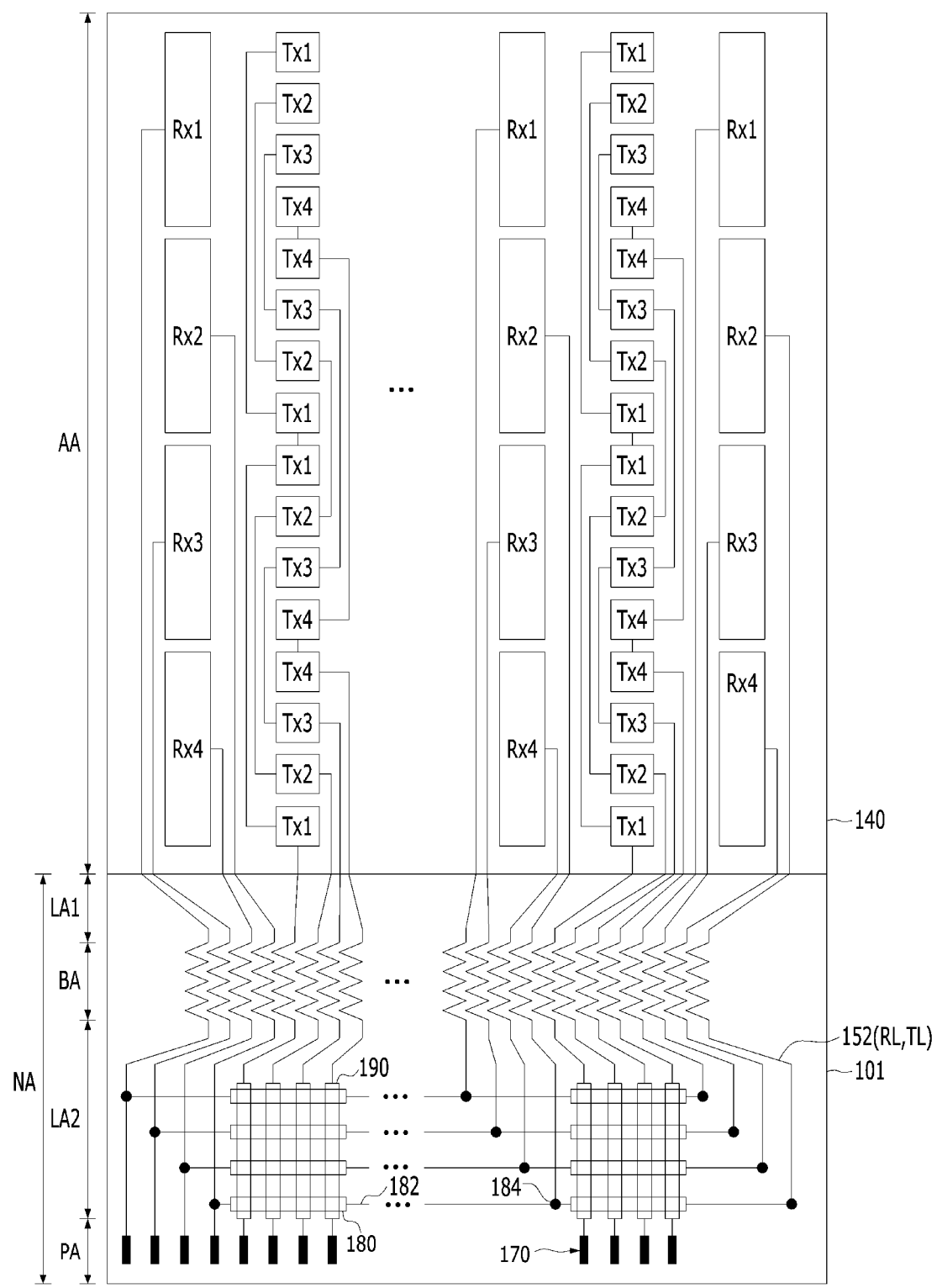
FIG. 17 is a plan view showing another aspect of a touch pad shown in FIG. 1.

Meanwhile, in the present disclosure, the structure in which each of the plurality of touch pads 170 is connected to a corresponding one of the plurality of touch sensing lines RL one to one has been described by way of example. Alternatively, as shown in FIG. 17, a plurality of touch sensing lines RL connected to each other through a connection line 182 may be connected to a single touch pad 170 many to one. For example, a plurality of first touch sensing lines RL1 connected to each other through a connection line 182 may be connected to a single touch pad 170, and a plurality of second touch sensing lines RL2 connected to each other through a connection line 182 may be connected to a single touch pad 170. That is, a plurality of m touch sensing lines RLm (m being a natural number) connected to each other through a connection line 182 is connected to a single touch pad 170. In this case, it is possible to reduce the number of touch pads 170, whereby it is possible to reduce the bezel area.

Also, in the present disclosure, the structure in which the length of each of the touch sensing electrodes RX is greater than the length of a corresponding one of the touch drive electrodes TX has been described by way of example. Alternatively, the length of each of the touch drive electrodes TX may be greater than the length of a corresponding one of the touch sensing electrodes RX. In this case, touch drive electrodes TX may be connected to each other through a connection line 182, and the touch drive electrodes TX connected to each other through the connection line 182 may be connected to a single touch pad 170.

Also, in the present disclosure, the structure in which the second mutual capacitor Cb is formed by overlapping with the first and second compensation electrodes 180 and 190 has been described by way of example. Alternatively, the first and second compensation electrodes 180 and 190 are opposite each other in the horizontal direction without overlapping with each other in order to form the second mutual capacitor Cb.

Furthermore, in the present disclosure, the structure in which the second mutual capacitor Cb is disposed on the substrate 101 has been described by way of example. Alternatively, the second mutual capacitor Cb may be disposed in the area other than the substrate 101. For example, the compensation circuit including the second mutual capacitor Cb may be disposed on a signal transmission film 194, as shown in FIG. 18A, or may be disposed in a touch drive integrated circuit 192, as shown in FIG. 18B or 18C.

Figure 18A:
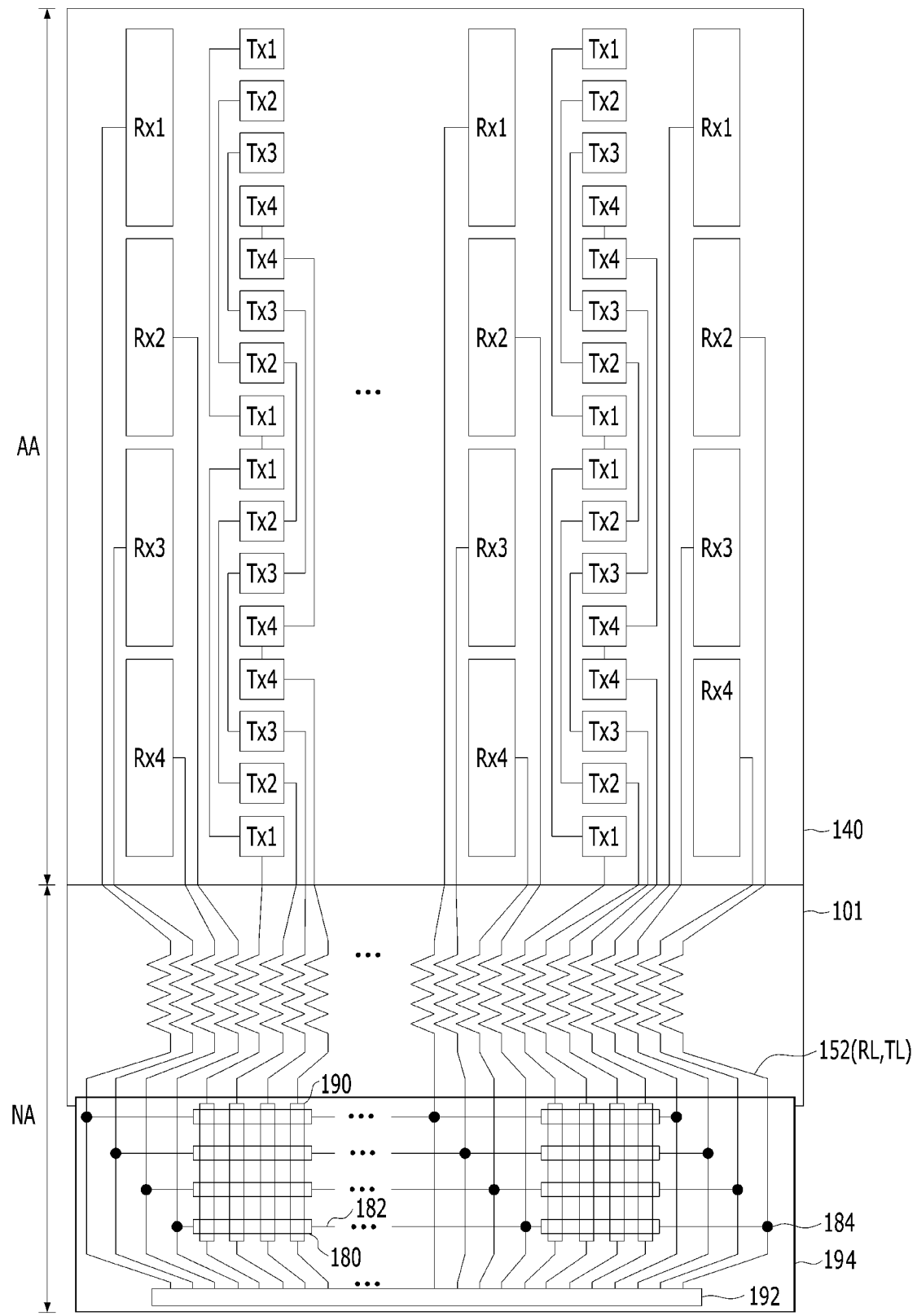
FIGS. 18A to 18C are plan views showing other aspects of a second mutual capacitor shown in FIG. 1.
Figure 18B:
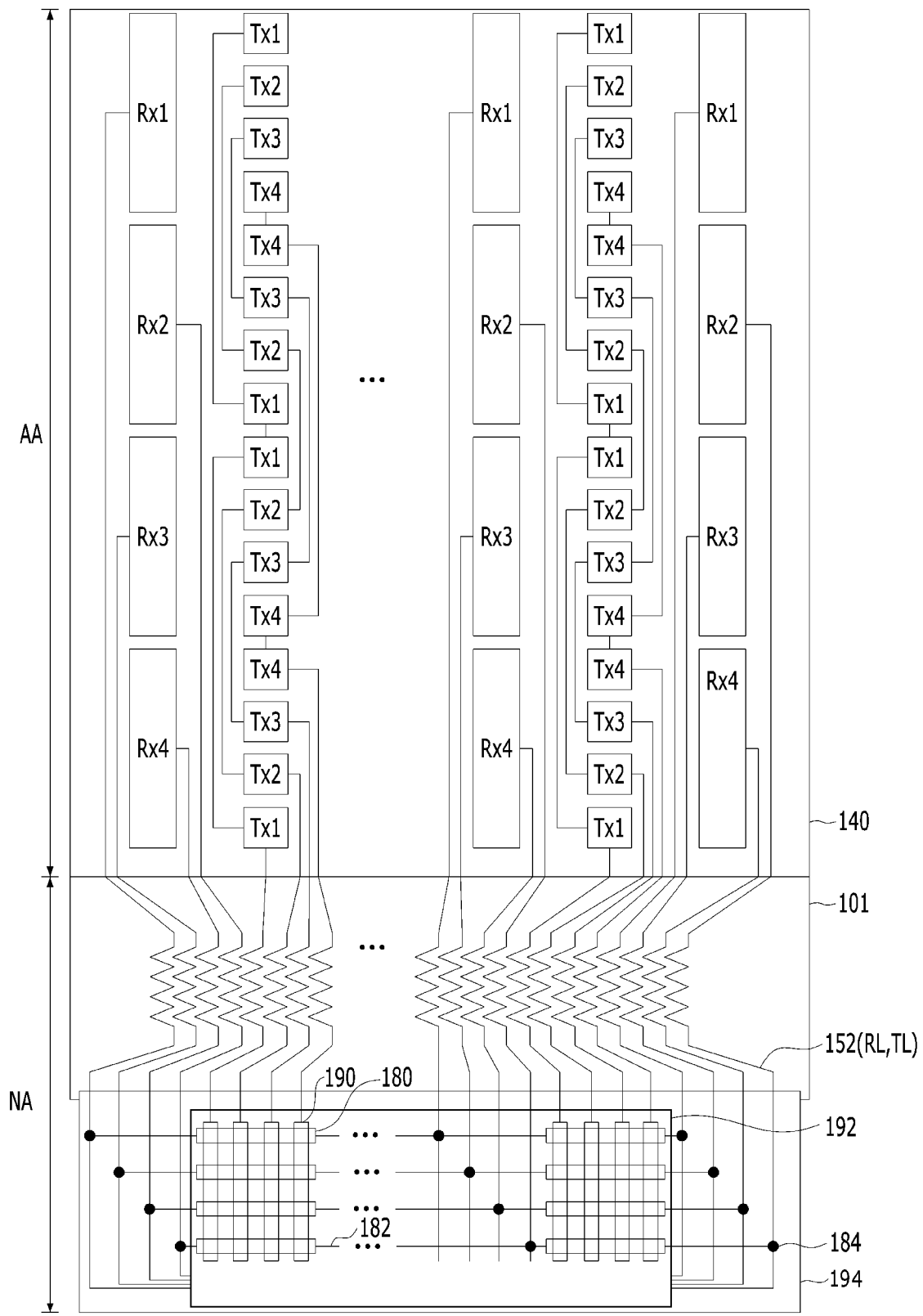
Figure 18C:
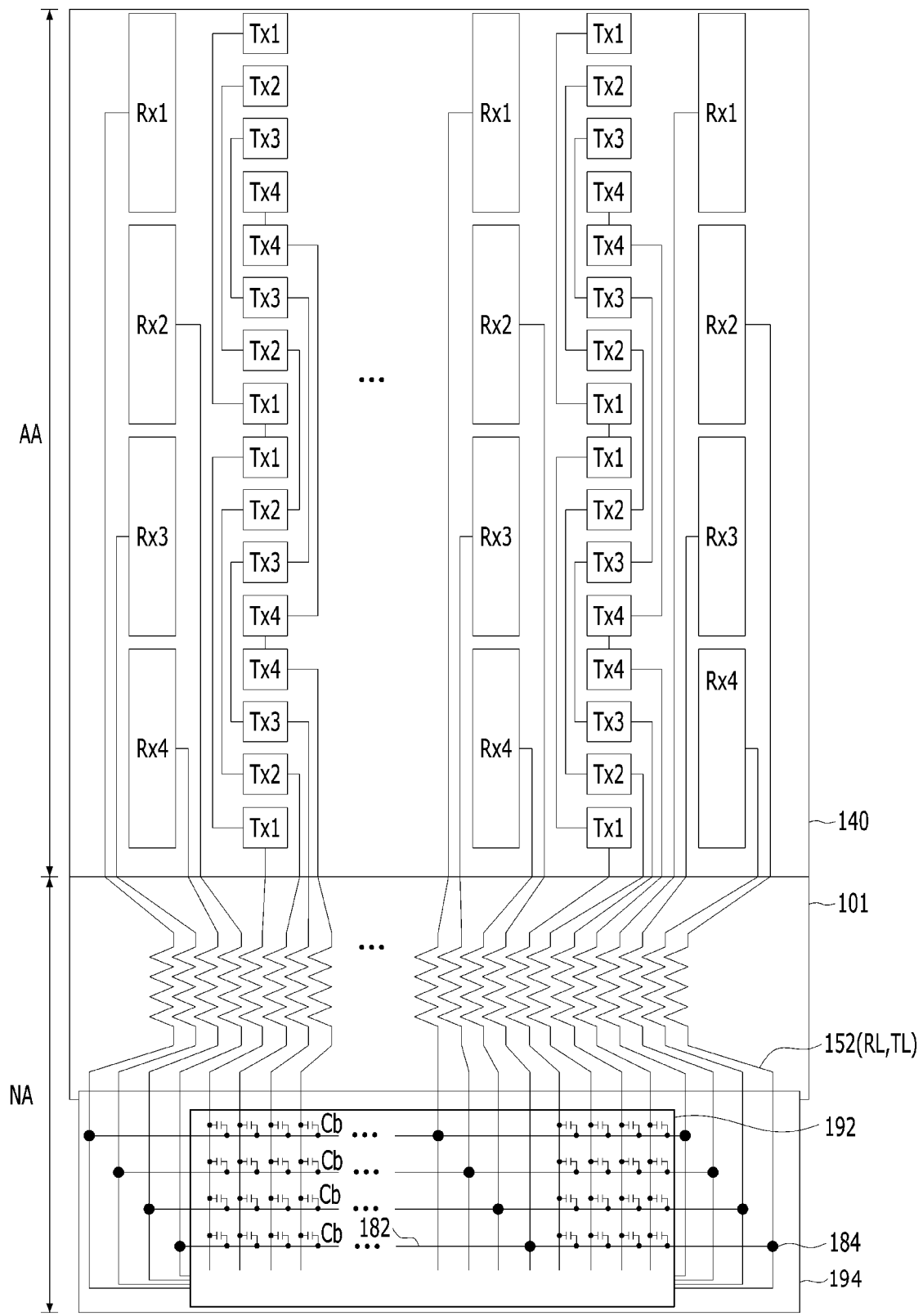

The second mutual capacitor Cb shown in FIG. 18A is formed by overlapping with the first and second compensation electrodes 180 and 190 on the signal transmission film 194, such as a tape carrier package (TCP) or a flexible printed circuit (FPC). In the second mutual capacitor Cb shown in FIG. 18B, the first and second compensation electrodes 180 and 190 are disposed in the touch drive integrated circuit 192 so as to overlap with each other. The second mutual capacitor Cb shown in FIG. 18C is mounted in the touch drive integrated circuit 192 in the form of a chip, or is mounted on the signal transmission film 194. One end of the chip-type second mutual capacitor Cb is connected to one of the touch sensing electrode Rx and the touch drive electrode Tx, and the other end of the chip-type second mutual capacitor Cb is connected to the other of the touch sensing electrode Rx and the touch drive electrode Tx.

In the present disclosure, as described above, the second mutual capacitor Cb having a value of second capacitance greater than the value of first capacitance of the first mutual capacitor Ca is disposed in the non-active area NA, excluding the active area AA. For example, the second mutual capacitor Cb is disposed in the non-active area including the periphery of the substrate 101 including the second link area LA2, the signal transmission film 194, and the touch drive integrated circuit 192. In the present disclosure, therefore, the value of capacitance of all mutual capacitors Cm is increased by the second mutual capacitor Cb, whereby it is possible to prevent deterioration in touch performance.

As is apparent from the above description, in the present disclosure, the first mutual capacitor disposed in the active area and the second mutual capacitor disposed in the non-active area are included, and therefore the value of capacitance of all mutual capacitors Cm is increased, whereby it is possible to prevent deterioration in touch performance.

Also, in the present disclosure, the value of capacitance of the second mutual capacitor is greater than the value of capacitance of the first mutual capacitor. Consequently, the effect of the value of capacitance of the first mutual capacitor upon the value of capacitance of all mutual capacitors Cm is small, whereby it is possible to prevent deviation in the value of capacitance of the first mutual capacitor by position of the touch sensing electrodes and the touch drive electrodes disposed in the active area.

Also, in the present disclosure, the value of capacitance of all mutual capacitors Cm is higher than the value of capacitance of the self-capacitor C_finger, whereby it is possible to prevent malfunction at the time of touch sensing.

Furthermore, the first and second compensation electrodes of the present disclosure are disposed in the non-active area in which the encapsulation unit is not formed or the peripheral area other than the substrate. In the present disclosure, therefore, the first and second compensation electrodes face each other in the state in which the dielectric film, which has a smaller thickness than the encapsulation unit, is disposed therebetween, whereby it is possible to increase the value of capacitance of the second mutual capacitor. In addition, it is not necessary to provide a contact hole formed through the encapsulation unit, which has a large thickness, whereby the manufacturing process is easily performed.

The above description merely illustrates the present disclosure, and it will be apparent to those skilled in the art that various modifications and variations can be made in the present disclosure without departing from the technical idea of the present disclosure. Therefore, the aspects disclosed in the specification of the present disclosure do not limit the present disclosure. The scope of the present disclosure should be interpreted by the following claims, and all technical concepts included in a range equivalent thereto should be interpreted as falling within the scope of the present disclosure.

What is claimed is:

1. A touch display device comprising:
    a substrate having an active area and a non-active area excluding the active area;
    a light-emitting element disposed in the active area of the substrate;
    an encapsulation unit disposed on the light-emitting element;
    a touch sensing electrode and a touch drive electrode disposed on the encapsulation unit and constituting a first mutual capacitor having a first capacitance value;
    a touch sensing line disposed in the non-active area and connected to the touch sensing electrode;
    a touch drive line disposed in the non-active area and connected to the touch drive electrode; and
    a compensation circuit disposed in the non-active area and having a second capacitance value greater than the first capacitance value,
    wherein the compensation circuit includes a first compensation electrode and a second compensation electrode,
    the second compensation electrode is connected to the touch drive line, and
    the first compensation electrode is connected to the touch sensing line through a connection line and overlaps with the second compensation electrode.

2. The touch display device according to claim 1, wherein the compensation circuit includes a second mutual capacitor connected to the first mutual capacitor in parallel, and the second mutual capacitor having the second capacitance value.

3. The touch display device according to claim 2, wherein the second mutual capacitor includes the first compensation electrode and the second compensation electrode.

4. The touch display device according to claim 3, further comprising:
    a thin film transistor connected to the light-emitting element; and
    a storage capacitor connected to the thin film transistor.

5. The touch display device according to claim 4, wherein the second compensation electrode includes a same material as source and drain electrodes of the thin film transistor and is disposed on a same plane as the source and drain electrodes, and wherein the first compensation electrode includes a same material as one of a gate electrode of the thin film transistor and a storage electrode of the storage capacitor and is disposed on a same plane as the one of the gate electrode and the storage electrode.

6. The touch display device according to claim 4, wherein the second compensation electrode includes a same material as a storage electrode of the storage capacitor and is disposed on a same plane as the storage electrode, and wherein the first compensation electrode includes a same material as a gate electrode of the thin film transistor and is disposed on a same plane as the gate electrode.

7. The touch display device according to claim 3, wherein the first and second compensation electrodes are disposed in the non-active area.

8. The touch display device according to claim 3, wherein the second compensation electrode includes a same material as the touch sensing electrode and the touch drive electrode, and the first compensation electrode includes a same material as source and drain electrodes of the thin film transistor and is disposed on a same plane as the source and drain electrodes.

9. The touch display device according to claim 3, further comprising:
a signal transmission film attached to at least one side of the substrate; and
a drive integrated circuit mounted on the signal transmission film,
wherein the first and second compensation electrodes are disposed on the signal transmission film or in the drive integrated circuit.

10. The touch display device according to claim 3, wherein the touch sensing electrode and the touch drive electrode are opposite each other in a horizontal direction, and the first and second compensation electrodes are opposite each other in a vertical direction.

11. The touch display device according to claim 3, wherein the touch sensing electrode and the touch drive electrode do not overlap with each other.

12. The touch display device according to claim 3, wherein the touch sensing electrode and the touch drive electrode are opposite with each other in a horizontal direction.

13. The touch display device according to claim 3, wherein the touch sensing electrode and the touch drive electrode do not overlap with each other.

14. The touch display device according to claim 2, further comprising:
a signal transmission film attached to at least one side of the substrate; and
a drive integrated circuit mounted on the signal transmission film,
wherein the second mutual capacitor is mounted in the drive integrated circuit in a form of a chip having the second capacitance value.

15. The touch display device according to claim 14, wherein one end of the chip-type second mutual capacitor is connected to one of the touch sensing electrode and the touch drive electrode, and the other end of the chip-type second mutual capacitor is connected to the other of the touch sensing electrode and the touch drive electrode.

16. The touch display device according to claim 1, wherein at least one of the touch sensing electrode or the touch drive electrode is formed in a mesh shape.

17. The touch display device according to claim 16, further comprising a bank disposed between light-emitting elements,
wherein the mesh-shaped touch sensing electrode and the mesh-shaped touch drive electrode overlap with the bank.

18. A touch display device comprising:
a touch sensing electrode and a touch drive electrode disposed over a substrate;
a first mutual capacitor including a touch sensing electrode and a touch drive electrode and having a first capacitance value;
a touch sensing line disposed in the non-active area and connected to the touch sensing electrode;
a touch drive line disposed in the non-active area and connected to the touch drive electrode; and
a second mutual capacitor connected to the first mutual capacitor in parallel and including first and second compensation electrodes respectively connected to one of the touch sensing electrode and the touch drive electrode,
wherein the second mutual capacitor has a second capacitance value greater than the first capacitance value, and
wherein the second mutual capacitor includes a first compensation electrode and a second compensation electrode,
the second compensation electrode is connected to the touch drive line, and
the first compensation electrode is connected to the touch sensing line through a connection line and overlaps the second compensation electrode.

19. The touch display device according to claim 18, further comprising:
a signal transmission film attached to at least one side of the substrate; and
a drive integrated circuit mounted on the signal transmission film,
wherein the first and second compensation electrodes are disposed on the signal transmission film or in the drive integrated circuit.

20. The touch display device according to claim 18, further comprising:
a signal transmission film disposed on at least one side of the substrate; and
a drive integrated circuit mounted on the signal transmission film,
wherein the second mutual capacitor is mounted in the drive integrated circuit having the second capacitance value.

* * * * *